United States Patent
Kuroda

(10) Patent No.: US 9,685,241 B2
(45) Date of Patent: Jun. 20, 2017

(54) MEMORY TEST CIRCUIT AND METHOD FOR CONTROLLING MEMORY TEST CIRCUIT

(71) Applicant: FUJITSU LIMITED, Kawasaki-shi, Kanagawa (JP)

(72) Inventor: Koji Kuroda, Fuji (JP)

(73) Assignee: FUJITSU LIMITED, Kawasaki (JP)

( * ) Notice: Subject to any disclaimer, the term of this patent is extended or adjusted under 35 U.S.C. 154(b) by 344 days.

(21) Appl. No.: 14/661,095

(22) Filed: Mar. 18, 2015

(65) Prior Publication Data

US 2015/0279484 A1 Oct. 1, 2015

(30) Foreign Application Priority Data

Mar. 31, 2014 (JP) ................. 2014-071704

(51) Int. Cl.
  *G01R 31/28* (2006.01)
  *G06F 11/00* (2006.01)
  *G11C 29/12* (2006.01)
  *G11C 8/16* (2006.01)

(52) U.S. Cl.
  CPC ............ *G11C 29/1201* (2013.01); *G11C 8/16* (2013.01)

(58) Field of Classification Search
  CPC ..... G11C 29/12; G11C 29/1201; G11C 29/44; G11C 29/4401; G01R 31/28; G01R 311/31813; G01R 31/31724; G01R 31/318385
  See application file for complete search history.

(56) References Cited

U.S. PATENT DOCUMENTS

| | | | | |
|---|---|---|---|---|
| 6,964,000 B2* | 11/2005 | Maeno | ................... | G11C 29/20 714/720 |
| 7,171,592 B2* | 1/2007 | Togashi | ............. | G11C 29/4401 714/54 |
| 7,257,751 B2* | 8/2007 | Stong | ............. | G01B 31/318307 714/733 |

FOREIGN PATENT DOCUMENTS

JP 2000-163993 6/2000

* cited by examiner

*Primary Examiner* — Shelly A Chase
(74) *Attorney, Agent, or Firm* — Staas & Halsey LLP

(57) ABSTRACT

A test circuit includes a control circuit that tests a memory having a plurality of data holding circuits holding data, a plurality of write ports, and a plurality of read ports, a write port selection circuit that selects any one of the plurality of write ports based on the write port identification information identifying any one of the plurality of write ports; and a read port selection circuit that selects any one of the plurality of read ports based on the read port identification information identifying any one of the plurality of read ports, wherein the control circuit sets the write port identification information and sets the read port identification information and carries out a test on the memory via the selected write port and the selected read port.

14 Claims, 28 Drawing Sheets

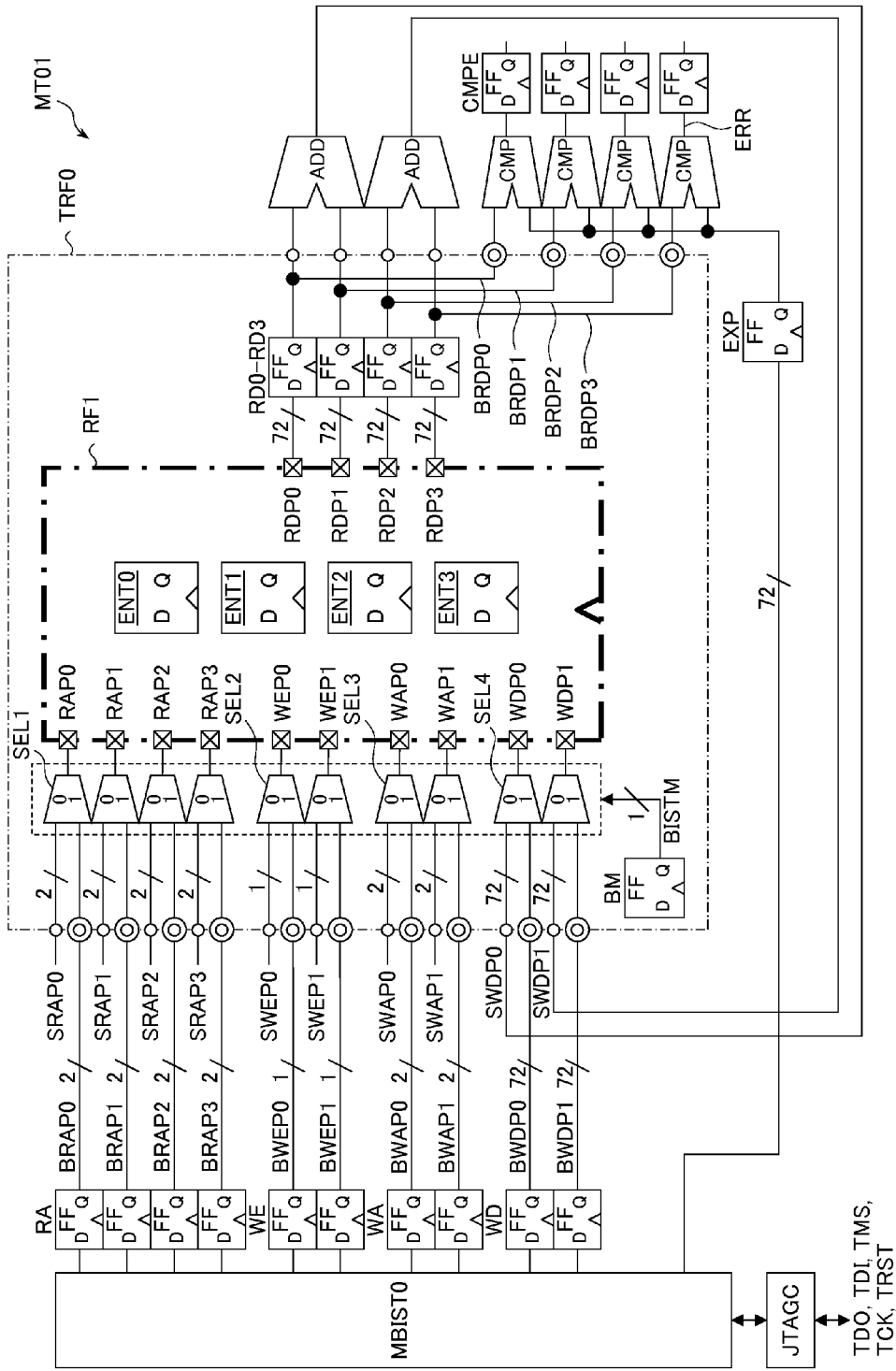

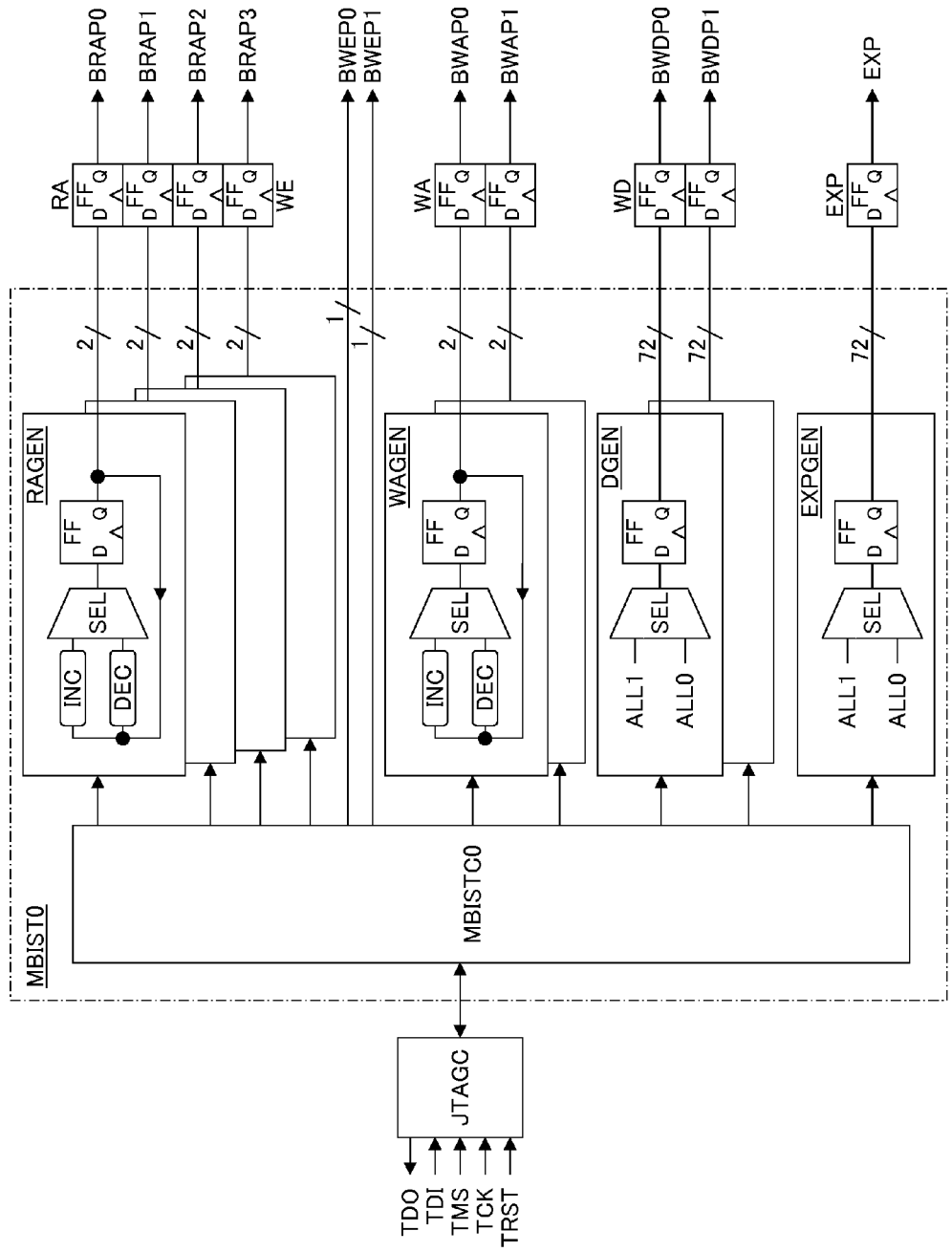

FIG. 9

| PATH | ELEMENT | MT1 (FIG. 4) | MT01 (FIG. 7) | EFFECT OF REDUCTION |
|---|---|---|---|---|
| BRAP | NUMBER OF LINES OF WIRING | 2 BITS × 1 PORT = 2 | 2 BITS × 4 PORTS = 8 | -6 |
| | NUMBER OF FF (RA) | 2 × 1 PORT = 2 | 2 × 4 PORTS = 8 | -6 |
| | NUMBER OF REPEATERS | 2 × 1 PORT = 2 | 2 × 4 PORTS = 8 | -6 |
| BWEP | NUMBER OF LINES OF WIRING | 1 BIT × 1 PORT = 1 | 1 BIT × 2 PORTS = 2 | -1 |
| | NUMBER OF FF (WE) | 1 × 1 PORT = 1 | 1 × 2 PORTS = 2 | -1 |
| | NUMBER OF REPEATERS | 1 × 1 PORT = 1 | 1 × 2 PORTS = 2 | -1 |
| BWAP | NUMBER OF LINES OF WIRING | 2 BITS × 1 PORT = 2 | 2 BITS × 2 PORTS = 4 | -2 |
| | NUMBER OF FF (WA) | 2 × 1 PORT = 2 | 2 × 2 PORTS = 4 | -2 |
| | NUMBER OF REPEATERS | 2 × 1 PORT = 2 | 2 × 2 PORTS = 4 | -2 |
| BWDP | NUMBER OF LINES OF WIRING | 72 BITS × 1 PORT = 72 | 72 BITS × 2 PORTS = 144 | -72 |
| | NUMBER OF FF (WD) | 72 × 1 PORT = 72 | 72 × 2 PORTS = 144 | -72 |
| | NUMBER OF REPEATERS | 72 × 1 PORT = 72 | 72 × 2 PORTS = 144 | -72 |
| DSEL | NUMBER OF NAND GATES | 7 × 72 BITS = 504 | 0 | +504 |
| CPM | NUMBER OF FF | 72 × 1 PORT = 72 | 72 × 4 PORTS = 288 | -216 |
| | NUMBER OF NAND GATES | 504 × 1 PORT = 504 | 504 × 4 PORTS = 2016 | -1512 |
| TOTAL | NUMBER OF LINES OF WIRING | 77 | 158 | -81 |
| | NUMBER OF FF | 149 | 446 | -297 |
| | NUMBER OF REPEATERS, NANDS | 1085 | 2174 | -1089 |

FIG. 10

| PATH | ELEMENT | CONFIGURATION CORRESPONDING TO MT1 (FIG.4) | CONFIGURATION CORRESPONDING TO MT01 (FIG.7) | EFFECT OF REDUCTION |
|---|---|---|---|---|
| BRAP | NUMBER OF LINES OF WIRING | 6 BITS × 1 PORT = 6 | 6 BITS × 10 PORTS = 60 | -54 |
| | NUMBER OF FF (RA) | 6 × 1 PORT = 6 | 6 × 10 PORTS = 60 | -54 |
| | NUMBER OF REPEATERS | 6 × 1 PORT = 6 | 6 × 10 PORTS = 60 | -54 |
| BRAP | NUMBER OF LINES OF WIRING | 1 BIT × 1 PORT = 1 | 1 BIT × 4 PORTS = 4 | -3 |
| | NUMBER OF FF (WE) | 1 × 1 PORT = 1 | 1 × 4 PORTS = 4 | -3 |
| | NUMBER OF REPEATERS | 1 × 1 PORT = 1 | 1 × 4 PORTS = 4 | -3 |
| BWAP | NUMBER OF LINES OF WIRING | 6 BITS × 1 PORT = 6 | 6 BITS × 4 PORTS = 24 | -18 |
| | NUMBER OF FF (WA) | 6 × 1 PORT = 6 | 6 × 4 PORTS = 24 | -18 |
| | NUMBER OF REPEATERS | 6 × 1 PORT = 6 | 6 × 4 PORTS = 24 | -18 |
| BWDP | NUMBER OF LINES OF WIRING | 72 BITS × 1 PORT = 72 | 72 BITS × 4 PORTS = 288 | -216 |
| | NUMBER OF FF (WD) | 72 × 1 PORT = 72 | 72 × 4 PORTS = 288 | -216 |
| | NUMBER OF REPEATERS | 72 × 1 PORT = 72 | 72 × 4 PORTS = 288 | -216 |
| DSEL | NUMBER OF NAND GATES | 7 × 72 BITS = 504 | 0 | +504 |
| CPM | NUMBER OF FF | 72 × 1 PORT = 72 | 72 × 10 PORTS = 720 | -648 |
| | NUMBER OF NAND GATES | 504 × 1 PORT = 504 | 504 × 10 PORTS = 5040 | -4536 |
| TOTAL | NUMBER OF LINES OF WIRING | 85 | 376 | -291 |
| | NUMBER OF FF | 157 | 1096 | -939 |
| | NUMBER OF REPEATERS, NANDS | 1093 | 5416 | -4323 |

FIG. 13

OPERATION OF RACNV

| BRAP0 | BRAP AM=0 | BRAP AM=1 | SELECTED ENTRY |
|---|---|---|---|
| 00 | 00 | 00 | ENT0 |
| 01 | 01 | 10 | ENT2 |
| 10 | 11 | 11 | ENT3 |

OPERATION OF WACNV

| BRAP0 | BWAP | SELECTED ENTRY |
|---|---|---|
| 00 | 00 | ENT0 |
| 01 | 10 | ENT2 |
| 10 | 11 | ENT3 |

MEMORY TEST CIRCUIT AND METHOD FOR CONTROLLING MEMORY TEST CIRCUIT

CROSS-REFERENCE TO RELATED APPLICATION

This application is based upon and claims the benefit of priority of the prior Japanese Patent Application No. 2014-071704, filed on Mar. 31, 2014, the entire contents of which are incorporated herein by reference.

FIELD

The embodiments discussed herein are related to a memory test circuit and a method for controlling the memory test circuit.

BACKGROUND

A method for testing a memory circuit by using a built-in self test (BIST) circuit incorporated into a semiconductor integrated circuit along with the memory circuit has been proposed. For example, the BIST circuit replaces, with refresh, an access more than the maximum address of each of a plurality of memory circuits with different address bit widths. Then, the BIST circuit performs the reading and writing of data from and to the plurality of memory circuits in parallel by prohibiting a comparison between read data and an expected value at the time of refresh. Japanese Laid-open Patent Publication No. 2000-163993 is an example of related art.

SUMMARY

According to an aspect of the invention, a test circuit includes a control circuit that tests a memory having a plurality of data holding circuits holding data, a plurality of write ports, and a plurality of read ports, a write port selection circuit that selects any one of the plurality of write ports based on the write port identification information identifying any one of the plurality of write ports; and a read port selection circuit that selects any one of the plurality of read ports based on the read port identification information identifying any one of the plurality of read ports, wherein the control circuit sets the write port identification information and sets the read port identification information and carries out a test on the memory via the selected write port and the selected read port.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a diagram depicting another example of the memory test circuit;

FIG. 8 is a diagram depicting an example of the test controlling portion depicted in FIG. 7;

FIG. 9 is a diagram depicting examples of the circuit sizes of the memory test circuits depicted in FIGS. 4 and 7;

FIG. 10 is a diagram depicting examples of the circuit sizes of memory test circuits that test a register file having specifications different from the specifications of the register file depicted in FIG. 4;

FIG. 13 is a diagram depicting an example of the operations of a read address conversion circuit and a write address conversion circuit depicted in FIG. 11;

DESCRIPTION OF EMBODIMENTS

For example, it is difficult to test a memory circuit having a plurality of data ports, a memory circuit in which a plurality of addresses are assigned to storing portions that hold data, a memory circuit that outputs data at different times depending on the pattern of an address, or the like with an existing BIST circuit. Therefore, in the past, a new memory test circuit has been designed and the memory circuit of this type has been tested.

The embodiments provide a memory test circuit and a method for controlling the memory test circuit that test a memory circuit by using an existing test circuit without an increase in circuit size.

Hereinafter, the embodiments will be described by using the drawings. A signal line by which a signal is transmitted and a terminal to which the signal is transmitted are identified with the same character as the name of the signal.

Figure 1:
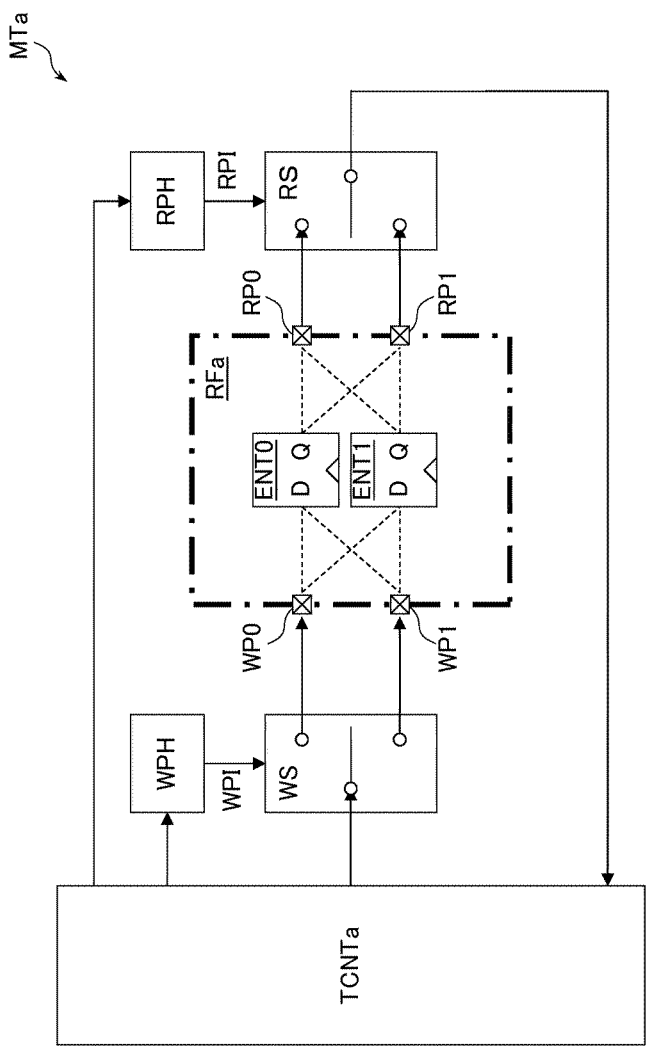
FIG. 1 is a diagram depicting an embodiment of a memory test circuit and a method for controlling the memory test circuit.

FIG. 1 depicts an embodiment of a memory test circuit and a method for controlling the memory test circuit. A memory test circuit MTa depicted in FIG. 1 includes a write port identification information holding portion WPH, a read port identification information holding portion RPH, a write port selecting portion WS, a read port selecting portion RS, and a test controlling portion TCNTa and carries out a test on a register file RFa. For example, the memory test circuit MTa is incorporated into a semiconductor integrated circuit (for example, a semiconductor chip) along with the register file RFa.

For example, the register file RFa has a plurality of entries ENT (ENT0 and ENT1) that store data, write ports WP (WP0 and WP1), and read ports RP (RP0 and RP1). The write port WP is used when data is written to the entry ENT. The read port RP is used when data held in the entry ENT is read. The register file RFa is an example of a memory circuit, and the entry ENT is an example of a storing portion.

The write port identification information holding portion WPH holds write port identification information WPI that identifies any one of the write ports WP0 and WP1. The read port identification information holding portion RPH holds read port identification information RPI that identifies any one of the read ports RP0 and RP1. The write port selecting portion WS selects any one of the plurality of write ports WP based on the write port identification information WPI. The read port selecting portion RS selects any one of the plurality of read ports RP based on the read port identification information RPI. The test controlling portion TCNTa sets the write port identification information WPI in the write port identification information holding portion WPH and sets the read port identification information RPI in the read port identification information holding portion RPH.

The test controlling portion TCNTa writes data to the entry ENT via the write port WP selected by the write port selecting portion WS based on the write port identification information WPI. For example, the test controlling portion TCNTa outputs a write address and write data to the write port WP selected by the write port selecting portion WS. Then, the write data is written to any one of the entries ENT0 and ENT1 which was selected based on the write address. The test controlling portion TCNTa reads data from the entry ENT via the read port RP selected by the read port selecting portion RS based on the read port identification information RPI. For example, the test controlling portion TCNTa outputs a read address to the read port RP selected by the read port selecting portion RS and receives data output to the read port RP from any one of the entries ENT0 and ENT1 which was selected in accordance with the read address. Then, for example, the test controlling portion TCNTa determines whether or not the register file RFa operates normally by comparing the read data with an expected value. That is, the test controlling portion TCNTa carries out a test that determines whether the register file RFa is good or not.

As a result, it is possible to carry out a test on the register file RFa having the plurality of write ports WP0 and WP1 and the plurality of read ports RP0 and RP1 by regarding the register file RFa as a register file having one write port WP and one read port RP. That is, the test controlling portion TCNTa is capable of testing the register file RFa having the plurality of write ports WP and the plurality of read ports RP by using an existing test circuit that tests one write port WP and one read port RP.

On the other hand, if the memory test circuit MTa does not have the write port identification information holding portion WPH, the read port identification information holding portion RPH, the write port selecting portion WS, and the read port selecting portion RS, it is difficult to carry out a test on the register file RFa by using the test controlling portion TCNTa. In this case, for example, a test controlling portion having a circuit that generates a test pattern for each of the write ports WP0 and WP1 and a circuit that generates a test pattern and an expected value for each of the read ports RP0 and RP1 and compares the data with the expected value is newly designed. With the memory test circuit MTa depicted in FIG. 1, as compared to the newly-designed test controlling portion, it is possible to reduce the circuit size of the test controlling portion TCNTa.

When the memory test circuit MTa is incorporated into the semiconductor integrated circuit along with the register file RFa, a reduction in the circuit size of the memory test circuit MTa makes it possible to reduce the chip size of the semiconductor integrated circuit. For example, when the packing density of the circuit and wiring is increased by a reduction in the circuit size of the memory test circuit MTa, it is possible to shorten the propagation delay time of a signal on a critical path and thereby increase the operating frequency of the semiconductor integrated circuit. That is, by suppressing an increase in the circuit size of the memory test circuit MTa, it is possible to suppress a reduction in the access performance of the register file RFa.

Figure 2:
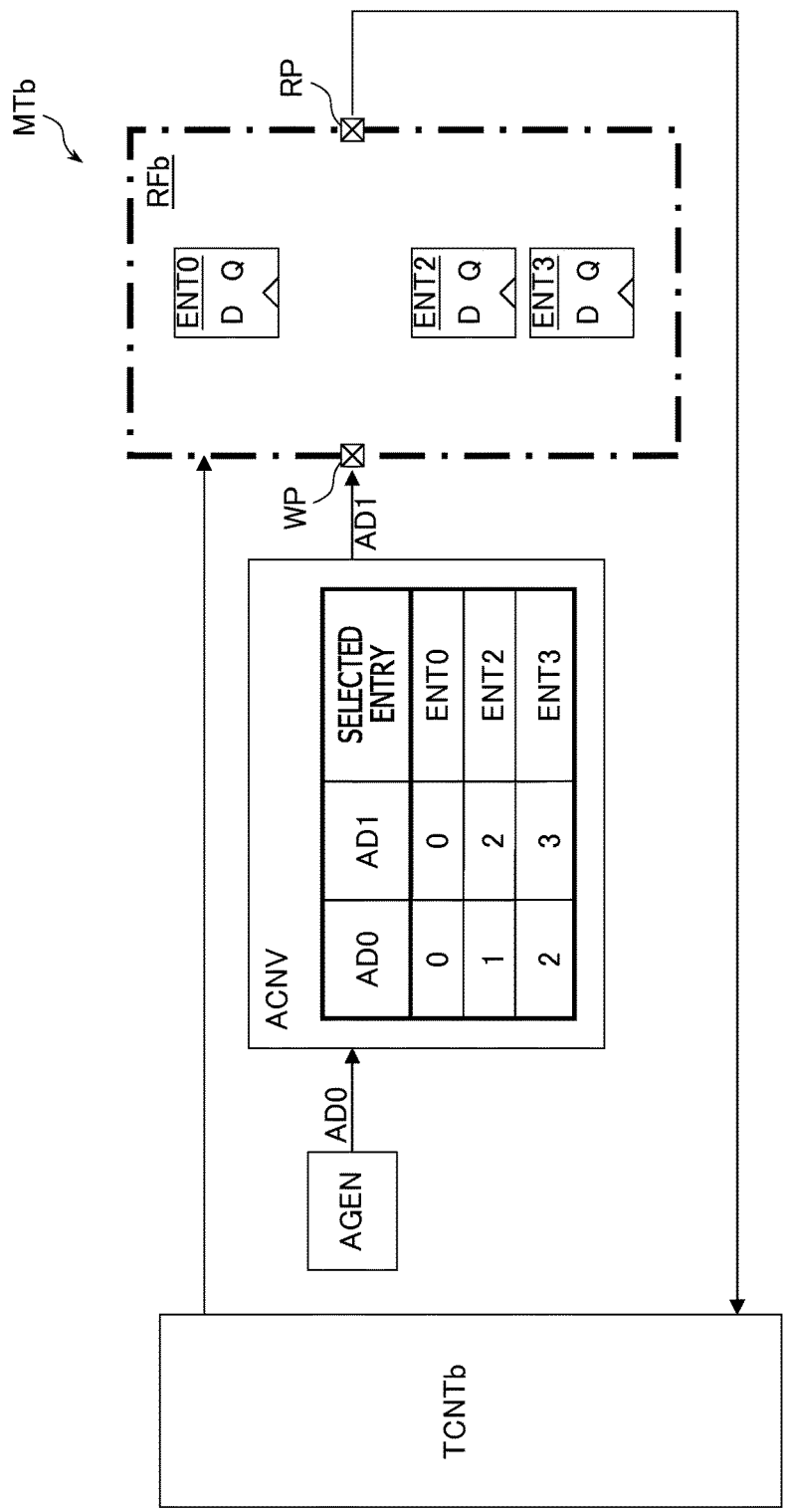
FIG. 2 is a diagram depicting another embodiment of the memory test circuit and the method for controlling the memory test circuit.

FIG. 2 depicts another embodiment of the memory test circuit and the method for controlling the memory test circuit. The elements identical or similar to the elements described in the embodiment depicted in FIG. 1 will be identified with the same characters, and their detailed explanations will be omitted. A memory test circuit MTb depicted in FIG. 2 includes an address generating portion AGEN, an address converting portion ACNV, and a test controlling portion TCNTb. For example, the memory test circuit MTb is incorporated into a semiconductor integrated circuit (for example, a semiconductor chip) along with a register file RFb.

For example, the register file RFb has a plurality of entries ENT (ENT0, ENT2, and ENT3) that store data, a write port WP, and a read port RP. The number at the end of each of the entries ENT0, ENT2, and ENT3 indicates the address assigned to each entry ENT. That is, inconsecutive addresses that do not include address "1" are assigned to the entries ENT0, ENT2, and ENT3. The register file RFa is an example of the memory circuit, and the entry ENT is an example of the storing portion.

The address generating portion AGEN sequentially generates consecutive addresses AD0 (for example, "0", "1", and "2"). Incidentally, the address generating portion AGEN may be provided in the test controlling portion TCNTb. The address converting portion ACNV converts the addresses AD0 generated by the address generating portion AGEN into addresses AD1 (that is, "0", "2", and "3") assigned to the entries ENT0, ENT2, and ENT3.

The test controlling portion TCNTb sequentially writes data to the entries ENT0, ENT2, and ENT3 based on the addresses AD0 generated by the address generating portion AGEN. Moreover, the test controlling portion TCNTb sequentially reads data from the entries ENT0, ENT2, and ENT3 based on the addresses AD0 generated by the address generating portion AGEN. For example, data is written to the entry ENT2 based on the address AD0 (="1"), and data is read from the entry ENT2 based on the address AD0 (="1"). Then, for example, the test controlling portion TCNTb determines whether or not the register file RFb operates normally by sequentially comparing the read data with the expected value. That is, the test controlling portion TCNTb carries out a test that determines whether the entries ENT0, ENT2, and ENT3 which are sequentially accessed by the addresses AD1 converted by the address converting portion ACNV are good or not.

In the memory test circuit MTb depicted in FIG. 2, the address converting portion ACNV converts the consecutive addresses AD0 generated by the existing address generating portion AGEN into the inconsecutive addresses AD1. As a result, by using the address generating portion AGEN that generates consecutive addresses, it is possible to test the register file RFb having the entries ENT to which the inconsecutive addresses are assigned. Therefore, as is the case with FIG. 1, it is possible to test the register file RFb by using the existing test circuit. Furthermore, it is possible to suppress an increase in the size of the circuit that tests the register file RFb and suppress a reduction in the performance of the register file RFb.

Figure 3:
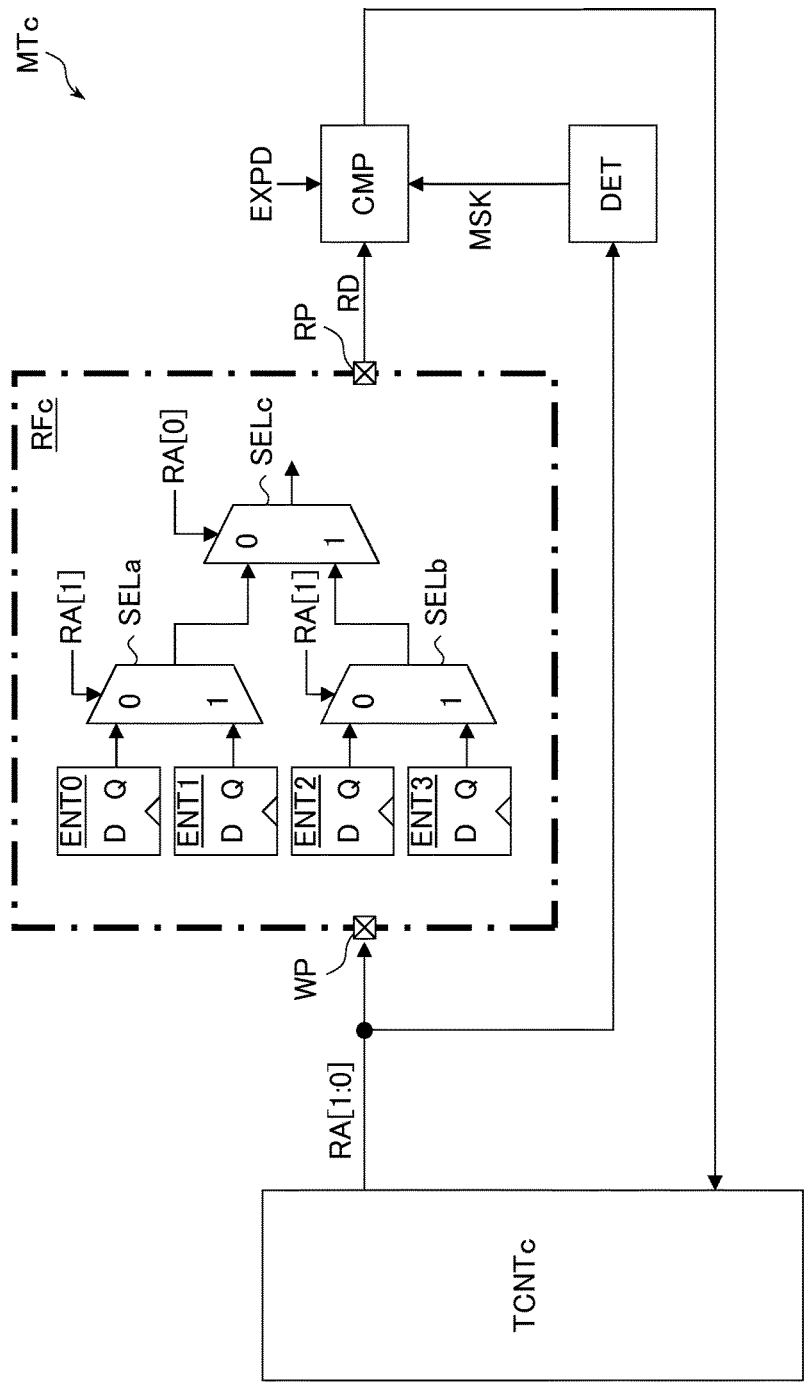
FIG. 3 is a diagram depicting still another embodiment of the memory test circuit and the method for controlling the memory test circuit.

FIG. 3 depicts another embodiment of the memory test circuit and the method for controlling the memory test circuit. The elements identical or similar to the elements described in the embodiment depicted in FIG. 1 will be identified with the same characters, and their detailed explanations will be omitted. A memory test circuit MTc depicted in FIG. 3 includes a detecting portion DET, a comparing portion CMP, and a test controlling portion TCNTc. For example, the memory test circuit MTc is incorporated into a semiconductor integrated circuit (for example, a semiconductor chip) along with a register file RFc.

For example, the register file RFc has a plurality of entries ENT (ENT0, ENT1, ENT2, and ENT3) that store data, a write port WP, and a read port RP. The register file RFc is an example of the memory circuit, and the entry ENT is an example of the storing portion. The register file RFc outputs read data RD at different times in accordance with a test pattern of a read address RA[1:0] indicating the entry ENT from which the data is to be read.

For example, the register file RFc has selectors SELa, SELb, and SELc that select data to be read from the entries ENT0 to ENT3. The selector SELa selects any one of the entries ENT0 and ENT1 in accordance with a higher-order bit RA[1] of the read address RA. The selector SELb selects any one of the entries ENT2 and ENT3 in accordance with the higher-order bit RA[1] of the read address RA. The selector SELc selects any one of the outputs of the selectors SELa and SELb in accordance with a lower-order bit RA[0] of the read address RA.

If the higher-order bit RA[1] of the read address RA changes, the read data RD is selected by the selector SELa (or SELb) and the selector SELc after the higher-order bit RA[1] has changed, and is output from the read port RP. That is, if the higher-order bit RA[1] changes, the read data RD is output to the read port RP after a lapse of the propagation delay time of the selectors SELa (or SELb) and SELc.

On the other hand, if the higher-order bit RA[1] of the read address RA does not change, the data that is output from the entry ENT is transmitted to the selector SELc before the start of a test. As a result, the read data RD is selected by the selector SELc after the lower-order bit RA[0] has changed, and is output from the read port RP. That is, if the lower-order bit RA[0] changes, the read data RD is output to the read port RP after a lapse of the propagation delay time of the selector SELc. As described above, the time at which the read data RD which is read in accordance with the test pattern including a change of the higher-order bit RA[1] of the read address RA is output is later than the time at which the read data RD which is read in accordance with the test pattern that does not include a change of the higher-order bit RA[1] is output.

If the detecting portion DET detects the test pattern of the read address RA[1:0] with which the time at which data is output becomes later than other times at which data is output, the detecting portion DET outputs a mask signal MSK. The comparing portion CMP disables a comparison between the read data RD and an expected value EXPD for a predetermined period of time until the read data RD is confirmed based on the mask signal MSK from the detecting portion DET. That is, the comparing portion CMP disables a comparison between the read data RD and the expected value EXPD for a predetermined period of time from the start of reading of data from the register file RFc.

The test controlling portion TCNTc determines whether the register file RFc is good or not based on the comparison result obtained by the comparing portion CMP. In the memory test circuit MTc, it is possible to prohibit the comparing portion CMP from performing a comparison between the read data RD and the expected value EXPD before the read data RD is confirmed and suppress erroneous determination made by the test controlling portion TCNTc as to whether the register file RFc is good or not. In other words, since it is possible to avoid a situation in which the register file RFc is erroneously determined to be bad, it is possible to suppress an interruption of a test due to erroneous determination.

As a result, even when the read data RD is output at different times in accordance with the test pattern of the read address RA[1:0], it is possible to test the register file RFc by using the existing test circuit as is the case with FIGS. 1 and 2. On the other hand, if the memory test circuit MTc does not have the detecting portion DET and the comparing portion CMP which are depicted in FIG. 3, the test controlling portion TCNTc erroneously determines that the register file RFc is bad and interrupts the test. Alternatively, a test controlling portion having the function of disabling a comparison between the read data RD and the expected value EXPD for a predetermined period of time in accordance with the test pattern of the read address RA[1:0] is newly designed.

Figure 4:
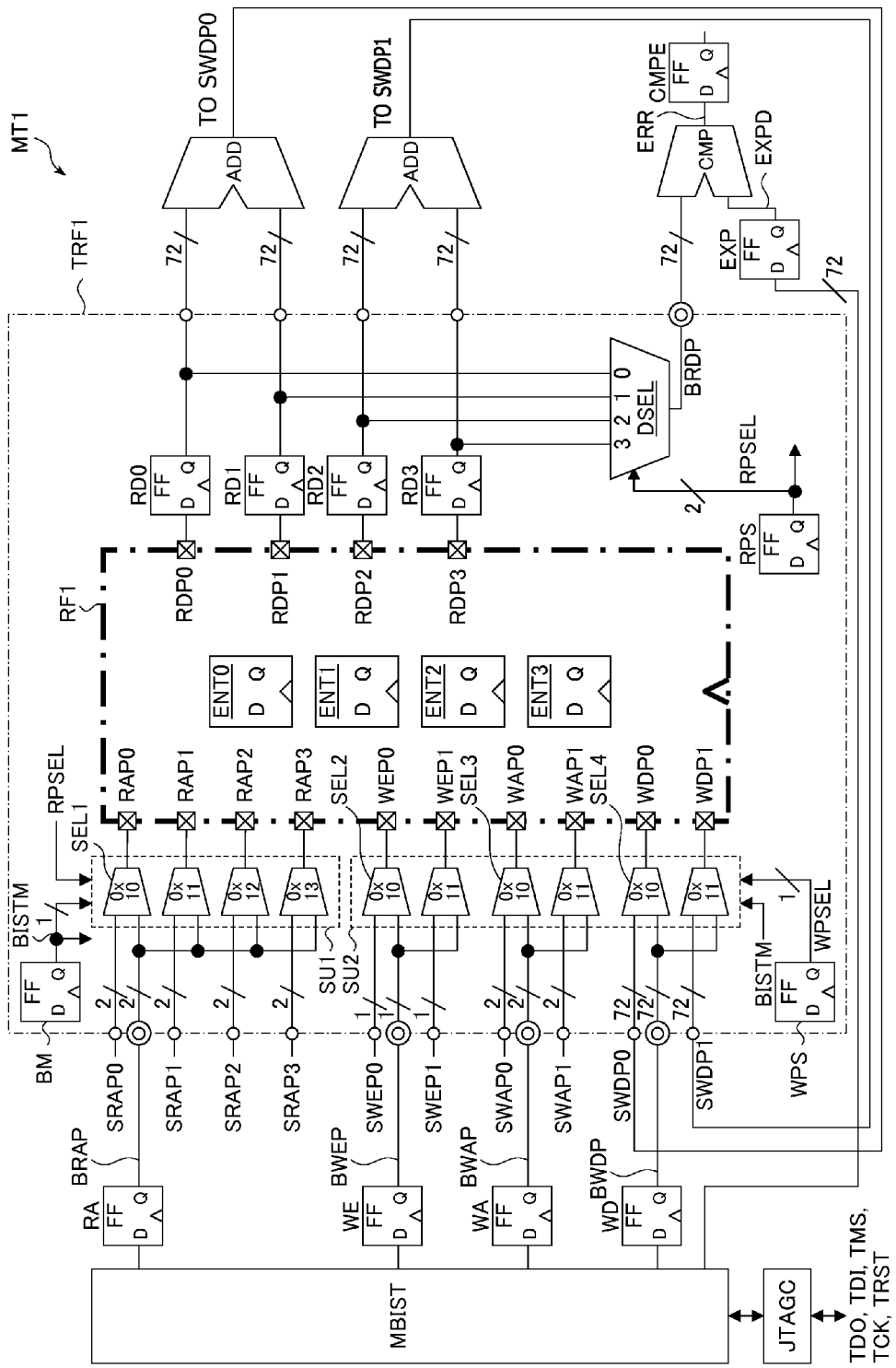
FIG. 4 is a diagram depicting yet another embodiment of the memory test circuit and the method for controlling the memory test circuit.

FIG. 4 depicts another embodiment of the memory test circuit and the method for controlling the memory test circuit. For example, a memory test circuit MT1 depicted in FIG. 4 tests a register file RF1 that is incorporated into a semiconductor integrated circuit. For example, the memory test circuit MT1 is incorporated into a semiconductor integrated circuit (for example, a semiconductor chip) along with the register file RF1. A region surrounded with a thick alternate long and short dashed line indicates the register file RF1, and a region surrounded by a thin alternate long and short dashed line indicates an expanded register file TRF1 including part of the test circuit. Rectangles each having a cross inside and being placed on the thick alternate long and short dashed line indicate ports (terminals) of the register file RF1. White circles placed on the thin alternate long and short dashed line indicate ports (terminals) of the register file TRF1 which are used in a normal operation mode (also called a system mode) of a central processing unit (CPU) core. Double circles placed on the thin alternate long and short dashed line indicate ports (terminals) of the register file TRF1 which are used in a test which is performed on the register file RF1. The number attached at the side of "/" on the signal line indicates a bit width.

For example, the register file RF1 is provided in the CPU core and has a plurality of entries ENT (ENT0, ENT1, ENT2, and ENT3) that hold data which is used in a computation to be performed by a CPU. For example, each entry ENT has 72 latch circuits (D flip-flops) that hold 72-bit data. Addresses for selection are sequentially assigned to the entries ENT, and, for example, the number at the end of each entry ENT indicates the address. Incidentally, the register file RF1 may be incorporated into control circuits other than the CPU core and hold data that is used in the other control circuits. Moreover, as long as the addresses are sequentially assigned to the entries ENT, the number of the entries ENT provided in the register file RF1 is not limited to four, and two or five or more entries ENT may be provided. The register file RF1 is an example of the memory circuit, and the entry ENT is an example of the storing portion.

The register file RF1 has two write data ports WDP (WDP0 and WDP1) and is capable of selectively writing data that is received by each of the write data ports WDP0 and WDP1 to any one of the four entries ENT. The entry ENT to which the data is to be written is selected in accordance with the address that is received by the write address port WAP (WAP0 or WAP1) corresponding to the write data port WDP. When data is written to the entry ENT, a write enable signal is supplied to the write enable port WEP (WEP0 or WEP1) corresponding to the write data port WDP. The write data port WDP, the write address port WAP, and the write enable port WEP are examples of a write port that is used when data is written to the entry ENT.

For example, each write data port WDP is 72-bit, each write address port WAP is 2-bit, and each write enable port WEP is 1-bit. The write access cycle of the register file RF1 is 1 clock cycle. That is, the register file RF1 is capable of holding write data WDP in the clock cycle after the clock cycle in which the write enable signal WEP, the write address WAP, and the write data WDP have been received.

Moreover, the register file RF1 has four read data ports RDP (RDP0, RDP1, RDP2, and RDP3) and is capable of selectively outputting data held in the four entries ENT to any one of the read data ports RDP. The entry ENT which outputs data is selected in accordance with the address that is received by the read address port RAP (RAP0, RAP1, RAP2, or RAP3) corresponding to the read data port RDP. The read data port RDP and the read address port RAP are examples of a read port that is used when the data held in the entry ENT is read.

Figure 5:
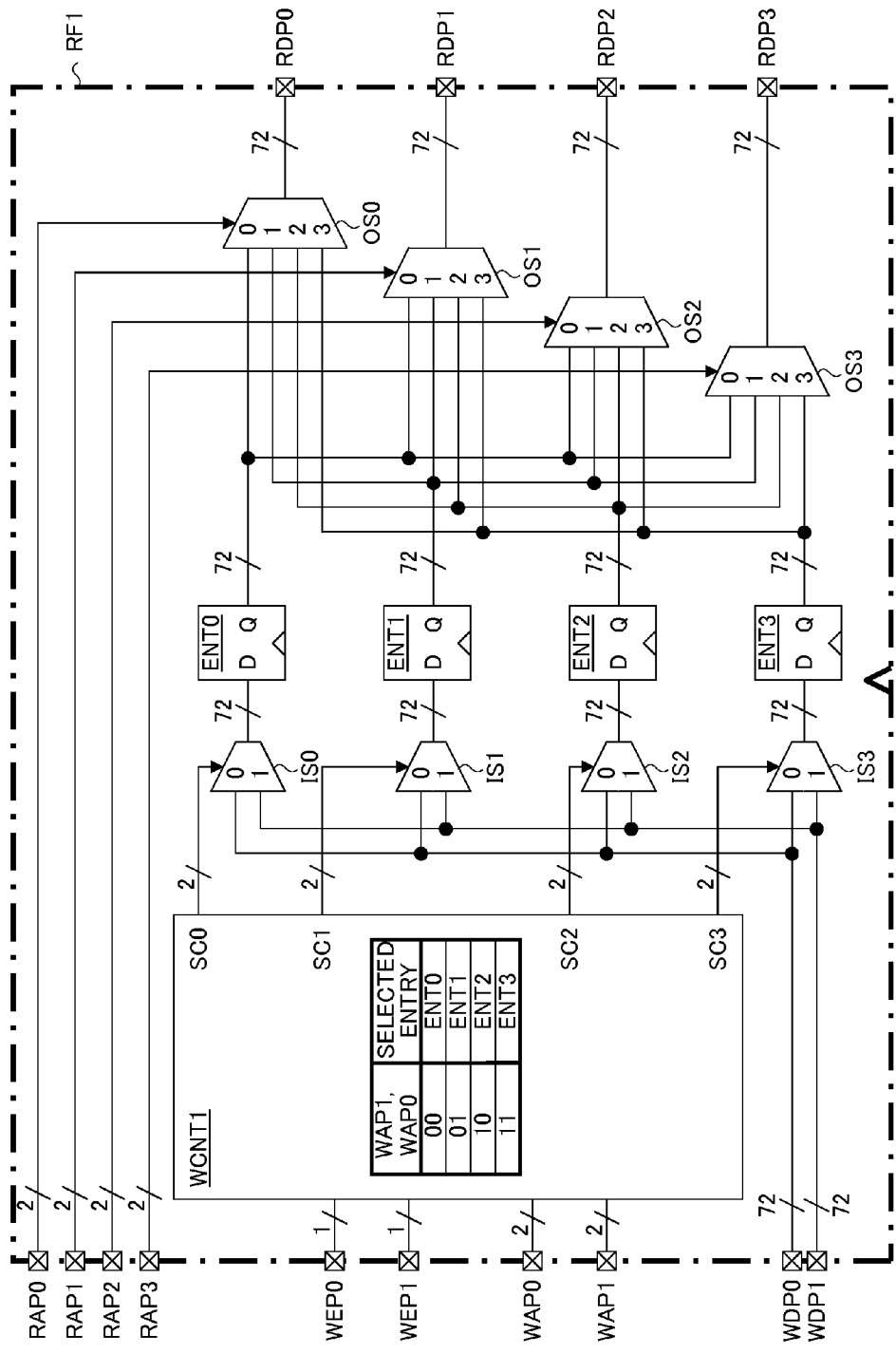
FIG. 5 is a diagram depicting an example of a register file depicted in FIG. 4.

For example, each read data port RDP is 72-bit and each read address port RAP is 2-bit. The read access cycle of the register file RF1 is 1 clock cycle. That is, the register file RF1 is capable of outputting the read data RDP in the clock cycle after the clock cycle in which the read address RAP has been received. An example of the internal configuration of the register file RF1 is depicted in FIG. 5.

On the other hand, the register file TRF1 which is expanded for a test has ports for testing (double circles in FIG. 4), one for each of a write enable signal BWEP, a write address BWAP, write data BWDP, a read address BRAP, and read data BRDP. That is, the memory test circuit MT1 is capable of testing a path coupled to the two write enable ports WEP by using one write enable port BWEP. The memory test circuit MT1 is capable of testing a path coupled to the two write address ports WAP by using one write address port BWAP. The memory test circuit MT1 is capable of testing a path coupled to the two write data ports WDP by using one write data port BWDP. The memory test circuit MT1 is capable of testing a path coupled to the four read address ports RAP by using one read address port BRAP.

The memory test circuit MT1 has a control portion JTAGC that controls the performance of a joint test action group (JTAG) boundary scan test and a test controlling portion MBIST. Moreover, the memory test circuit MT1 has a plurality of latch circuits FF, selector portions SU1 and SU2, a selector DSEL, and a comparing portion CMP. For example, the latch circuit FF is a D flip-flop that operates in synchronization with a clock.

The control portion JTAGC receives test signals TDI, TMS, TCK, and TRST in accordance with JTAG and outputs a signal TD0. Here, the signal TDI indicates Test Data In, the signal TMS indicates Test Mode Select, the signal TCK indicates Test Clock, the signal TRST indicates Test Reset, and the signal TD0 indicates Test Data Out. For example, in a test which is performed on the register file RF1, the plurality of latch circuits FF are coupled in series and function as a shift register by being controlled by the control portion JTAGC. By the shift operation of the shift register, data for testing is held in each latch circuit FF and the data held in each latch circuit FF is read therefrom. That is, a boundary scan test is carried out.

The test controlling portion MBIST is a circuit conducting a BIST that automatically tests the register file RF1, and generates a test pattern based on the control by the control portion JTAGC and determines whether the test is good or not. For example, the test pattern includes a read address, a write enable signal, a write address, write data, and an expected value. The latch circuits FF (RA, WE, WA, WD, and EXP) coupled to the output of the test controlling portion MBIST output a read address BRAP, a write enable signal BWEP, a write address BWAP, write data PWDP, and an expected value EXPD, respectively.

In the following description, the latch circuits FF are also referred to as latch circuits RA, WE, WA, WD, EXP, BM, WPS, RPS, RD0, RD1, RD2, and RD3. The latch circuit WPS is an example of a write port identification information holding portion that holds write port selection information WPSEL indicating any one of the plurality of write enable ports WEP, any one of the plurality of write address ports WAP, and any one of the plurality of write data ports WDP. The write port selection information WPSEL is an example of write port identification information that identifies any one of the plurality of write enable ports WEP, any one of the plurality of write address ports WAP, and any one of the plurality of write data ports WDP. The latch circuit RPS is an example of a read port identification information holding portion that holds read port selection information RPSEL indicating any one of the plurality of read address ports RAP and any one of the plurality of read data ports RDP. The read port selection information RPSEL is an example of read port identification information that identifies any one of the plurality of read address ports RAP and any one of the plurality of read data ports RDP. Incidentally, in addition to a test which is carried out on the register file RF1, the test controlling portion MBIST may carry out a test on other circuits (a computing unit, a state machine, and so forth) which are incorporated into the CPU core.

The selector portion SU1 has four selectors SEL1 that select any one of a read address SRAP (SRAP0, SRAP1, SRAP2, or SRAP3) and the read address BRAP from the latch circuit RA. The read address BRAP used in the BIST is a signal shared by the selectors SEL1. The read addresses SRAP0 to SRAP3 are used during the system mode of the CPU core and are supplied to the read addresses ports RAP0 to RAP3, respectively.

The number placed on the input side in each selector SEL1 indicates the relationship between the logic of a test mode signal BISTM and an input terminal which becomes enabled. By using the latch circuit BM, the test mode signal BISTM is set to logic 1 during a test mode in which the BIST is carried out and is set to logic 0 during the system mode. In addition, if the logic of the test mode signal BISTM is logic 1, a lower input of each selector SEL1 is selected; if the logic of the test mode signal BISTM is logic 0, an upper input of each selector SEL1 is selected.

The number placed on the output side in each selector SEL1 indicates the value of 2-bit read port selection information RPSEL that is output from the latch circuit RPS set at the time of a BIST. For example, if the read port selection information RPSEL is "0", the selector SEL1 coupled to the read address port RAP0 outputs the read address BRAP as the read address RAP0 and the other selectors SEL1 are disabled. If the read port selection information RPSEL is "2", the selector SEL1 coupled to the read address port RAP2 outputs the read address BRAP as the read address RAP2 and the other selectors SEL1 are disabled. Incidentally, the number of latch circuits RPS (that is, the number of bits of the read port selection information RPSEL) is n when the number of read data ports RDP is $2^n$ (n is an integer greater than or equal to 1).

The symbol "x" placed on the output side in each selector SEL1 indicates that the value of the read port selection information RPSEL is disabled during the system mode and each selector SEL1 outputs the read address SRAP as the read address RAP. The selector portion SU1 is an example of a read port selecting portion that selects any one of the read address ports RAP based on the read port selection information RPSEL.

By providing the selector portion SU1 in the register file TRF1, it is possible to couple the output of the latch circuit RA selectively to any one of the read address ports RAP0 to RAP3. As a result, the test controlling portion MBIST is capable of testing the paths and circuits coupled to the read address ports RAP0 to RAP3 by using the common read address BRAP. Therefore, it is possible to reduce the circuit size of the memory test circuit MT1 as compared to a case in which the read address BRAP is generated for each of the read address ports RAP0 to RAP3.

The selector portion SU2 has two selectors SEL2 that select any one of a write enable port SWEP (SWEP0 or SWEP1) and the write enable signal BWEP from the latch circuit WE. The selector portion SU2 has two selectors SEL3 that select any one of a write address SWAP (SWAP0 or SWAP1) and the write address BWAP from the latch circuit WA. The selector portion SU2 has two selectors SEL4 that select any one of write data SWDP (SWDP0 or SWDP1) and the write data BWDP from the latch circuit WD.

As is the case with the selector SEL1, the number placed on the input side in each of the selectors SEL2, SEL3, and SEL4 indicates the relationship between the logic of the test mode signal BISTM and an input terminal which becomes enabled. The number placed on the output side in each of the selectors SEL2, SEL3, and SEL4 indicates the value of 1-bit write port selection information WPSEL that is output from the latch circuit WPS set at the time of a BIST.

For example, if the write port selection information WPSEL is "0", the selector SEL2 coupled to the write enable port WEP0 outputs the write enable signal BWEP as the write enable signal WEP0 and the other selector SEL2 is disabled. If the write port selection information WPSEL is "0", the selector SEL3 coupled to the write address port WAP0 outputs the write address BWAP as the write address WAP0 and the other selector SEL3 is disabled. Likewise, if the write port selection information WPSEL is "1", the selector SEL4 coupled to the write data port WDP1 outputs the write data BWDP as the write address WDP1 and the other selector SEL4 is disabled. Incidentally, the number of latch circuits WPS (that is, the number of bits of the write port selection information WPSEL) is n if the number of write data ports WDP is $2^n$ (n is an integer greater than or equal to 1).

The symbol "x" placed on the output side in each selector SEL2 indicates that the value of the write port selection information WPSEL is disabled during the system mode and each selector SEL2 outputs the write enable signal SWEP as the write enable signal WEP. The symbol "x" placed on the output side in each selector SEL3 indicates that the value of the write port selection information WPSEL is disabled during the system mode and each selector SEL3 outputs the write address SWAP as the write address WAP. The symbol "x" placed on the output side in each selector SEL4 indicates that the value of the write port selection information WPSEL is disabled during the system mode and each selector SEL4 outputs the write data SWDP as the write data WDP.

The selector portion SU2 is an example of a write port selecting portion that selects any one of the plurality of write enable ports WEP, any one of the plurality of write address ports WAP, and any one of the plurality of write data ports WDP based on the write port selection information WPSEL. The write enable signal WEP, the write address WAP, and the write data WDP are examples of a write access signal writing data to the entry ENT. The read address RAP and the read data RDP are examples of a read access signal reading data from the entry ENT.

By providing the selector portion SU2 in the register file TRF1, it is possible to couple the output of the latch circuit WE selectively to any one of the write enable ports WEP0 and WEP1. As a result, the test controlling portion MBIST is capable of testing the paths and circuits coupled to the write enable ports WEP0 and WEP1 by using the common write enable signal BWEP. Therefore, as compared to a case in which the write enable signal BWEP is generated for each of the write enable ports WEP0 and WEP1, it is possible to reduce the circuit size of the memory test circuit MT1.

Moreover, by providing the selector portion SU2 in the register file TRF1, it is possible to couple the output of the latch circuit WA selectively to any one of the write address ports WAP0 and WAP1. As a result, the test controlling portion MBIST is capable of testing the paths and circuits coupled to the write address ports WAP0 and WAP1 by using the common write address BWAP. Therefore, as compared to a case in which the write address BWAP is generated for each of the write address ports WAP0 and WAP1, it is possible to reduce the circuit size of the memory test circuit MT1.

Furthermore, by providing the selector portion SU2 in the register file TRF1, it is possible to couple the output of the latch circuit WD selectively to any one of the write data ports WDP0 and WDP1. As a result, the test controlling portion MBIST is capable of testing the paths and circuits coupled to the write data ports WDP0 and WDP1 by using the common write data BWDP. Therefore, as compared to a case in which the write data BWDP is generated for each of the write data ports WDP0 and WDP1, it is possible to reduce the circuit size of the memory test circuit MT1.

The latch circuits RD (RD0, RD1, RD2, and RD3) hold data which is output from the read data ports RDP (RDP0, RDP1, RDP2, and RDP3). The selector DSEL selects the read data RDP to be output from the latch circuits RD0 to RD3 in accordance with the value of the read port selection information RPSEL and outputs the selected read data RDP as the read data BRDP. For example, if the read port selection information RPSEL is "0", the selector DSEL outputs, as the read data BRDP, the read data RDP0 which is output from the latch circuit RD0. If the read port selection information RPSEL is "3", the selector DSEL outputs, as the read data BRDP, the read data RDP3 which is output from the latch circuit RD3.

The comparing portion CMP compares each bit of the 72-bit read data BRDP with each bit of the 72-bit expected value EXPD which is output from the latch circuit EXP, and outputs an error signal ERR. For example, if all the bits of the read data RD and the expected value EXPD agree with each other, the comparing portion CMP outputs a logic-0 error signal ERR indicating that the paths and circuits passed the test. If at least 1 bit of the read data RD does not agree with 1 bit of the expected value EXPD, the comparing portion CMP outputs a logic-1 error signal ERR indicating that the paths and circuits failed the test. A latch circuit CMPE holds the error signal ERR.

By providing the selector DSEL in the register file TRF1, it is possible to determine whether or not the data which is output from the read data ports RDP0 to RDP3 is correct by using one comparing portion CMP. As a result, it is possible to test the operation of the register file RF1 by using one comparing portion CMP and test the paths coupled to the read data ports RDP0 to RDP3. Therefore, as compared to a case in which the comparing portion CMP is provided for each of the read data ports RDP0 to RDP3, it is possible to reduce the circuit size of the memory test circuit MT1. The effect of reduction of the circuit size of the memory test circuit MT1 will be described in FIGS. 9 and 10.

Furthermore, when the memory test circuit MT1 tests the register file RF1 having a plurality of ports for each type of signal, the memory test circuit MT1 makes it possible to access the register file TRF1 as a register file TRF1 having one port for each type of signal. As a result, the memory test circuit MT1 is capable of testing the register file RF1 having the plurality of ports WEP, the plurality of ports WAP, the plurality of ports WDP, the plurality of ports RAP, and the plurality of ports RDP by using the existing test controlling portion MBIST that tests the single port BWEP, the single port BWAP, the single port BWDP, the single port BRAP, and the single port BRDP.

The adders ADD are included in, for example, the computing unit of the CPU core and operate during the system mode. For example, each adder ADD performs a computation on the read data RDP which is output from the register file RF1 and returns the computation result to the register file RF1 via the write data port WDP.

FIG. 5 depicts an example of the register file RF1 depicted in FIG. 4. The register file RF1 includes a write control portion WCNT1, input selectors IS (IS0, IS1, IS2, and IS3), output selectors OS (OS0, OS1, OS2, and OS3), and the entries ENT0 to ENT3 depicted in FIG. 4.

The write control portion WCNT1 outputs a 2-bit selector control signal SC (SC0, SC1, SC2, or SC3) in accordance with the write address WAP corresponding to the write enable signal WEP indicating a valid level (for example, logic 1). For example, a higher-order bit of each selector control signal SC is used to control the operation of enabling and disabling the input selector IS, and a lower-order bit of each selector control signal SC is used to select the input terminal of the input selector IS.

For example, if the write enable signal WEP0 indicates the valid level and the write address WAP0 indicates "0", the write control portion WCNT1 outputs the selector control signal SC0 that enables the input selector IS0 and makes the input selector IS0 select the write data WDP0. Likewise, if the write enable signal WEP1 indicates the valid level and the write address WAP0 indicates "2", the write control portion WCNT1 outputs the selector control signal SC2 that enables the input selector IS2 and makes the input selector IS2 select the write data WDP1. Each input selector IS outputs any one of the write data WDP0 and WDP1 to the entry ENT based on the selector control signal SC. Incidentally, if both the write enable signals WEP0 and WEP1 indicate the valid level and the write addresses WAP0 and WAP1 are different from each other, the pieces of data received by the write data ports WDP0 and WDP1 are written to different entries ENT.

Each output selector OS selects data which is received by the input terminal corresponding to the read address RAP and outputs the selected data as the read data RDP. The numbers written at the input terminal of each output selector OS each indicate the value of the read address RAP. For example, if the read address RAP is "1", each output selector OS selects data which is output from the entry ENT1; if the read address RAP is "2", each output selector OS selects data which is output from the entry ENT2. Incidentally, the output selectors OS0 to OS3 are capable of operating at the same time.

Figure 6:
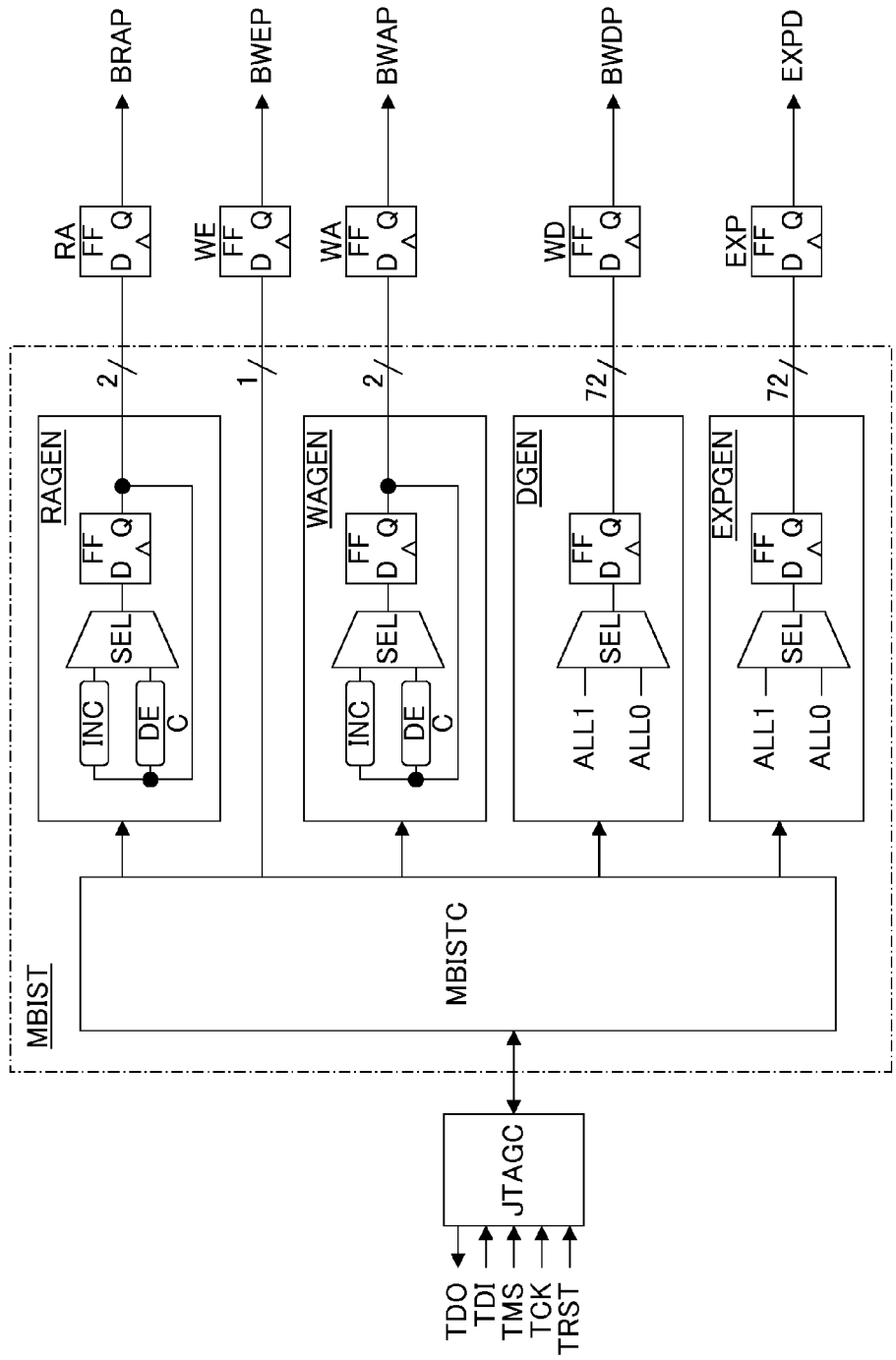
FIG. 6 is a diagram depicting an example of a test controlling portion depicted in FIG. 4.

FIG. 6 depicts an example of the test controlling portion MBIST depicted in FIG. 4. The test controlling portion MBIST includes signal generating portions RAGEN, WAGEN, DGEN, and EXPGEN and an operation controlling portion MBISTC that controls the operations of the signal generating portions RAGEN, WAGEN, DGEN, and EXPGEN.

The signal generating portion RAGEN has an incrementer INC, a decrementer DEC, a selector SEL, and a latch circuit FF for the read address RAP and sequentially generates the read address RAP that consecutively changes in ascending or descending order. The signal generating portion WAGEN has an incrementer INC, a decrementer DEC, a selector SEL, and a latch circuit FF for the write address WAP and sequentially generates the write address WAP that consecutively changes in ascending or descending order.

The signal generating portion DGEN has a selector SEL that selects ALL0 data or ALL1 data and a latch circuit FF and generates ALL0 or ALL1 write data BWDP. The signal generating portion EXPGEN has a selector SEL that selects an ALL0 expected value or ALL1 expected value and a latch circuit FF and generates ALL0 or ALL1 expected value EXPD.

The operation controlling portion MBISTC generates initial values of the read address RAP and the write address WAP, information indicating an ascending or descending order, and information indicating set values of the write data WDP and the expected value EXPD. Moreover, the operation controlling portion MBISTC generates the write enable signal BWEP in synchronization with the output of the write address WAP and the write data WDP.

As described in FIG. 4, when the memory test circuit MT1 tests the register file RF1 having a plurality of ports for each type of signal, the memory test circuit MT1 makes it possible to access the register file TRF1 as a register file TRF1 having one port for each type of signal. As a result, the test controlling portion MBIST is capable of using the existing circuit that has one signal generating portion RAGEN, one signal generating portion WAGEN, and one signal generating portion DGEN and tests a single-port register file. Moreover, as compared to a case in which a common read address BRAP, a common write enable signal BWEP, a common write address BWAP, and a common write data BWDP are not used, it is possible to reduce the circuit size of the test controlling portion MBIST.

The memory test circuit MT1 depicted in FIG. 4 carries out a test on the register file RF1 as described below. For example, the test on the register file RF1 is carried out along with a test on a semiconductor integrated circuit including a CPU core or independently of the test on the semiconductor integrated circuit. Moreover, the test on the register file RF1 may be carried out on a wafer into which a plurality of semiconductor integrated circuits are incorporated or on a semiconductor device on which semiconductor integrated circuit chips are packaged during the process of producing (the process of testing) a semiconductor integrated circuit.

In the test which is carried out on the register file RF1, the memory test circuit MT1 first sets the latch circuits BM, WPS, and RPS depicted in FIG. 4 by using boundary scan, for example. As a result of the latch circuit BM being set, the register file RF is set to a test mode. The selector portions SU1 and SU2 select the ports PAP, WEP, WAP, and WDP which are used for the test based on the settings of the latch circuits WPS and RPS.

For example, the selector portions SU1 and SU2 select the read address port RAP0, the write enable port WEP0, the write address port WAP0, and the write data port WDP0, and the selector DSEL selects the read data port RDP0. The memory test circuit MT1 generates the write enable signal BWEP which is supplied to the write enable port WEP0 and generates the write data BWDP which is supplied to the write data port WDP0. Then, the memory test circuit MT1 sequentially increases the write address BWAP which is supplied to the write address port WAP0 and writes data to each of the entries ENT0 to ENT3.

Next, the memory test circuit MT1 sequentially increases the read address BRAP which is supplied to the read address port RAP0 and reads data from each of the entries ENT0 to ENT3 via the read data port RDP0. The memory test circuit MT1 sequentially compares the read data with the expected value EXPD. Then, the memory test circuit MT1 determines whether or not the path and circuit coupled to each of the write enable port WEP0, the write address port WAP0, and the write data port WDP0 operate normally. Moreover, the memory test circuit MT1 determines whether or not the path and circuit coupled to each of the read address port RAP0 and the read data port RDP0 operate normally.

Next, the memory test circuit MT1 resets the latch circuit RPS, for example, and selects the read address port RAP1 and the read data port RDP1. The memory test circuit MT1 sequentially increases the read address BRAP which is supplied to the read address port RAP1 and reads data from each of the entries ENT0 to ENT3 via the read data port RDP1. The memory test circuit MT1 sequentially compares the read data with the expected value EXPD. Then, the memory test circuit MT1 determines whether or not the path and circuit coupled to each of the read address port RAP1 and the read data port RDP0 operate normally.

Likewise, the memory test circuit MT1 resets the latch circuit RPS and sequentially selects a pair of the read address port RAP2 and the read data port RDP2 and a pair of the read address port RAP3 and the read data port RDP3. The memory test circuit MT1 sequentially reads data from each of the entries ENT0 to ENT3 via the read data ports RDP2 and RDP3. Then, the memory test circuit MT1 determines whether or not the path and circuit coupled to each of the read address ports RAP2 and RAP3 and the read data ports RDP2 and RDP3 operate normally.

Moreover, the memory test circuit MT1 selects the write enable port WEP1, the write address port WAP1, and the write data port WDP1 and carries out a test similar to the test described above. As the pair of the read address port RAP and the read data port RDP, any one of a pair of RAP0 and RDP0, a pair of RAP1 and RDP1, a pair of RAP2 and RDP2, and a pair of RAP3 and RDP3 may be selected. Then, the memory test circuit MT1 determines whether or not the paths and circuits coupled to the write enable port WEP1, the write address port WAP1, and the write data port WDP1 operate normally.

As described above, by repeatedly conducting a plurality of tests by sequentially changing the set values of the latch circuits WPS and RPS and sequentially selecting the ports RAP, WEP, WAP, WDP, and RDP, it is possible to test the paths and circuits coupled to all the ports of the register file RF1.

FIG. 7 depicts another example of the memory test circuit. The elements identical or similar to the elements depicted in FIG. 4 will be identified with the same characters, and their detailed explanations will be omitted. A register file RF1 has the same or similar configuration as the configuration of FIG. 5. That is, the register file RF1 includes four entries ENT0 to ENT3, two write data ports WDP0 and WDP1, and four read data ports RDP0 to RDP3. A memory test circuit MT01 depicted in FIG. 7 has an expanded register file TRF0 including part of the test circuit in place of the register file TRF1 depicted in FIG. 4. Moreover, the memory test circuit MT01 has a test controlling portion MBIST0 in place of the test controlling portion. MBIST depicted in FIG. 4.

The register file TRF0 has four read address ports BRAP (BRAP0, BRAP1, BRAP2, and BRAP3) for testing, one for each of the read address ports RAP (RAP0 to RAP3) of the register file RF1. The register file TRF0 has two write enable ports BWEP (BWEP0 and BWEP1) for testing, one for each of the write enable ports WEP (WEP0 and WEP1) of the register file RF1. The register file TRF0 has two write address ports BWAP (BWAP0 and BWAP1) for testing, one for each of the write address ports WAP (WAP0 and WAP1) of the register file RF1. The register file TRF0 has two write data ports BWDP (BWDP0 and BWDP1) for testing, one for each of the write data ports WDP (WDP0 and WDP1) of the register file RF1. Furthermore, the register file TRF0 has four read data ports BRDP (BRDP0 to BRDP3) for testing, one for each of the read data ports RDP (RDP0 to RDP3) of the register file RF1.

In the memory test circuit MT01, a plurality of read addresses BRAP0 to BRAP3, a plurality of write enable signals BWEP0 and BWEP1, a plurality of write addresses BWAP0 and BWAP1, and a plurality of pieces of write data BWDP0 and BWDP1 are generated. Moreover, the memory test circuit MT01 has a comparison circuit CMP for each of the read data ports RDP (RDP0 to RDP3). That is, the memory test circuit MT01 generates the read address BRAP, the write address BWAP, and the write data BWDP for each port and compares the read data RDP with the expected value EXPD for each port.

FIG. 8 depicts an example of the test controlling portion MBIST0 depicted in FIG. 7. The elements identical or similar to the elements depicted in FIG. 6 will be identified with the same characters, and their detailed explanations will be omitted.

The test controlling portion MBIST0 has a plurality of signal generating portions RAGEN, a plurality of signal generating portions WAGEN, a plurality of signal generating portions DGEN, a signal generating portion EXPGEN, and an operation controlling portion MBISTC0. That is, the signal generating portions RAGEN are provided, one for each of the read addresses BRAP0 to BRAP3, and the signal generating portions WAGEN are provided, one for each of the write addresses BWAP0 to BWAP3. The signal generating portions DGEN are provided, one for each of the pieces of write data BWD0 and BWD1. In addition to the function of the operation controlling portion MBISTC depicted in FIG. 6, the operation controlling portion MBISTC0 has the function of controlling the operations of the plurality of signal generating portions RAGEN, the plurality of signal generating portions WAGEN, and the plurality of signal generating portions DGEN. As described above, the circuit size of the test controlling portion MBIST0 is larger than the circuit size of the test controlling portion MBIST depicted in FIG. 6.

FIG. 9 depicts examples of the circuit sizes of the memory test circuits MT1 and MT01 depicted in FIGS. 4 and 7, respectively. In FIG. 9, "the number of repeaters" indicates the number of repeaters (that is, buffer circuits) which are placed on a path of each wiring, and "the number of NAND gates" indicates the number obtained by converting each circuit to a 2-input NAND gate. For example, a repeater has two complementary metal oxide semiconductor (CMOS) inverters coupled in series, and the number of transistors of the repeater is the same as that of a 2-input NAND gate (4 transistors).

As depicted in a lower right corner of FIG. 9, the memory test circuit MT1 depicted in FIG. 4 is capable of cutting 81 lines of wiring, 297 latch circuits FF, and 1089 logic gates (in 4-transistor terms) from the memory test circuit MT01 depicted in FIG. 7. Therefore, it is possible to reduce the circuit size of the memory test circuit MT1, the circuit size that does not contribute to the performance of the CPU core, as compared to the circuit size of FIG. 7 and reduce the chip size of the semiconductor integrated circuit into which the CPU core is incorporated. This makes it possible to reduce the production cost of a semiconductor integrated circuit chip. Furthermore, it is possible to reduce the time spent on designing the memory test circuit MT1 as compared to the time spent on designing the CPU core including the circuits depicted in FIG. 7 and reduce the cost of development of the semiconductor integrated circuit.

Moreover, since it is possible to reduce the circuit size of the memory test circuit MT1, it is possible to reduce the area of the CPU core as compared to the area of the CPU core including the circuits of FIG. 7 and thereby increase the packing density of the circuits and wiring which contribute to the performance of the CPU core. For example, as a result of the wiring length being shortened, it is possible to reduce the time of delay in propagation of a signal on a critical path as compared to the time of delay in propagation of a signal on a critical path in the CPU core including the circuits of FIG. 7. As a result, it is possible to increase the operating frequency of the CPU core as compared to the operating frequency of the CPU core including the circuits of FIG. 7.

FIG. 10 depicts examples of the circuit sizes of memory test circuits that test a register file having specifications different from the specifications of the register file RF1 depicted in FIG. 4. For example, a register file which is tested by the memory test circuits depicted in FIG. 10 has 64 entries with 64 bit-width, 4 write data ports, and 10 read data ports. Since the 64 entries are selected, each of the read address port BRAP and the write address port BWAP is 6-bit.

The effect of reduction of the circuit size of the memory test circuit MT1, the effect obtained when the memory test circuit MT1 depicted in FIG. 4 and the memory test circuit MT01 depicted in FIG. 7 are changed to the circuit that tests the register file with the above-described specifications, is listed in a lower right corner of FIG. 10. That is, the configuration corresponding to the memory test circuit MT1 depicted in FIG. 4 is capable of cutting 291 lines of wiring, 939 latch circuits FF, and 4323 logic gates (in 4-transistor terms) from the configuration corresponding to the memory test circuit MT01 depicted in FIG. 7. As described above, the larger the number of entries and ports of the register file, the greater the effect of reduction of the circuit size.

As described above, also in the embodiments depicted in FIGS. 4 to 10, as is the case with the embodiment depicted in FIG. 1, it is possible to carry out a test on the register file RF1 by using the existing test controlling portion MBIST that tests a single-port register file. Moreover, as compared to a case in which a common read address BRAP, a common write enable signal BWEP, a common write address BWAP, and a common write data BWDP are not used, it is possible to reduce the circuit size of the memory test circuit MT1. Furthermore, in the embodiments depicted in FIGS. 4 to 10, it is possible to carry out a test by regarding the multiport register file RF1 as a single-port register file. As a result, it is possible to carry out a test by using the simpler test controlling portion MBIST than the test controlling portion MBIST0 depicted in FIG. 8.

Figure 11:
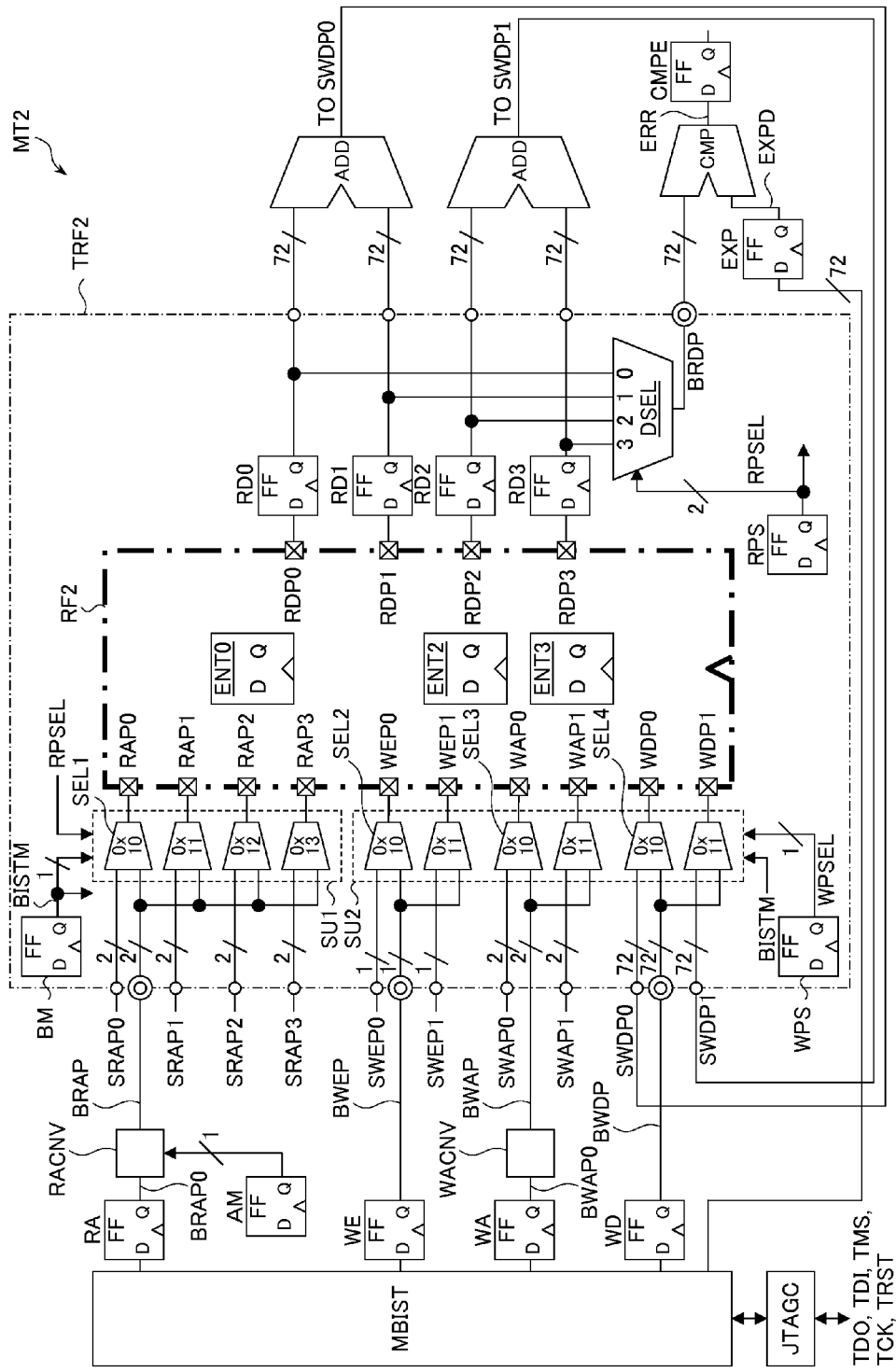
FIG. 11 is a diagram depicting another embodiment of the memory test circuit and the method for controlling the memory test circuit.

FIG. 11 depicts another embodiment of the memory test circuit and the method for controlling the memory test circuit. The elements identical or similar to the elements described in the embodiments depicted in FIGS. 4 to 10 will be identified with the same characters, and their detailed explanations will be omitted.

A memory test circuit MT2 depicted in FIG. 11 has an expanded register file TRF2 in place of the expanded register file TRF1 depicted in FIG. 4. The expanded register file TRF2 has a register file RF2. Moreover, the memory test circuit MT2 includes a read address conversion circuit RACNV coupled to an output terminal Q of a latch circuit RA, a write address conversion circuit WACNV coupled to an output terminal Q of a latch circuit WA, and a latch circuit AM. The other configuration of the memory test circuit MT2 is the same as the configuration of the memory test circuit MT1 depicted in FIG. 4.

For example, the memory test circuit MT2 depicted in FIG. 11 tests the register file RF2 provided in a CPU core which is incorporated into a semiconductor integrated circuit. For example, the memory test circuit MT2 is incorporated into a semiconductor integrated circuit (for example, a semiconductor chip) along with the register file RF2.

Figure 12:
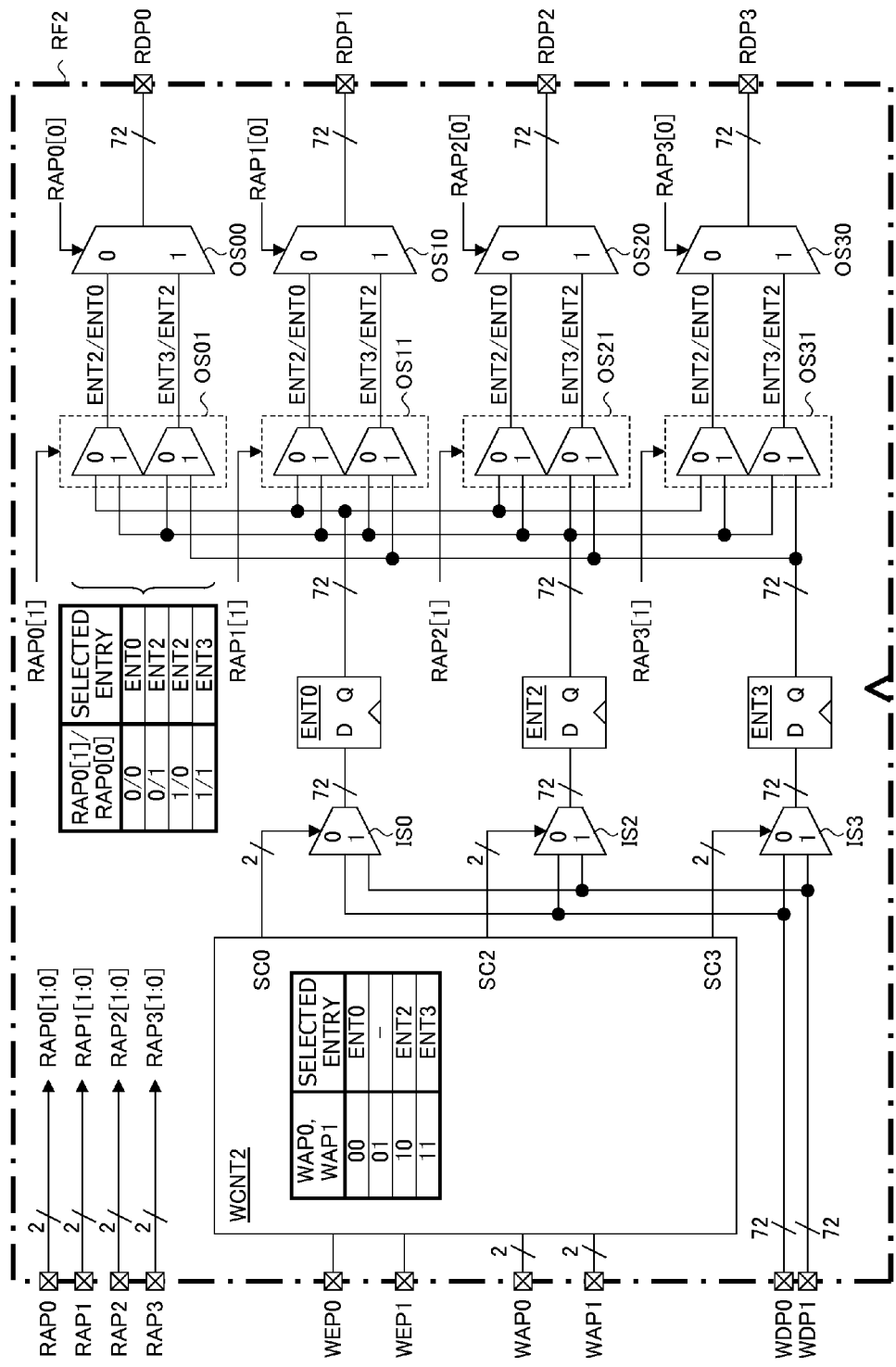
FIG. 12 is a diagram depicting an example of the register file depicted in FIG. 11.

The register file RF2 has three entries ENT0, ENT2, and ENT3 to which inconsecutive addresses are assigned. As is the case with the register file RF1, the write access cycle of the register file RF2 is 1 clock cycle, and the read access cycle of the register file RF2 is 1 clock cycle. An example of the internal configuration of the register file RF2 is depicted in FIG. 12. The register file RF2 is an example of the memory circuit, and the entry ENT is an example of the storing portion.

The read address conversion circuit RACNV converts the value of the read address BRAP0 (2 bit) output from the latch circuit RA and outputs the resultant address as a read address BRAP. Moreover, the read address conversion circuit RACNV changes the conversion specifications of the read address BRAP0 in accordance with the logic held in the latch circuit AM. The write address conversion circuit WACNV converts the value of the write address BWAP0 (2 bit) output from the latch circuit WA and outputs the resultant address as a write address BWAP. Examples of the operations of the read address conversion circuit RACNV and the write address conversion circuit WACNV are depicted in FIG. 13. The latch circuit AM is an example of an address holding portion that holds information indicating any one of a plurality of read addresses BRAP.

Figure 16:
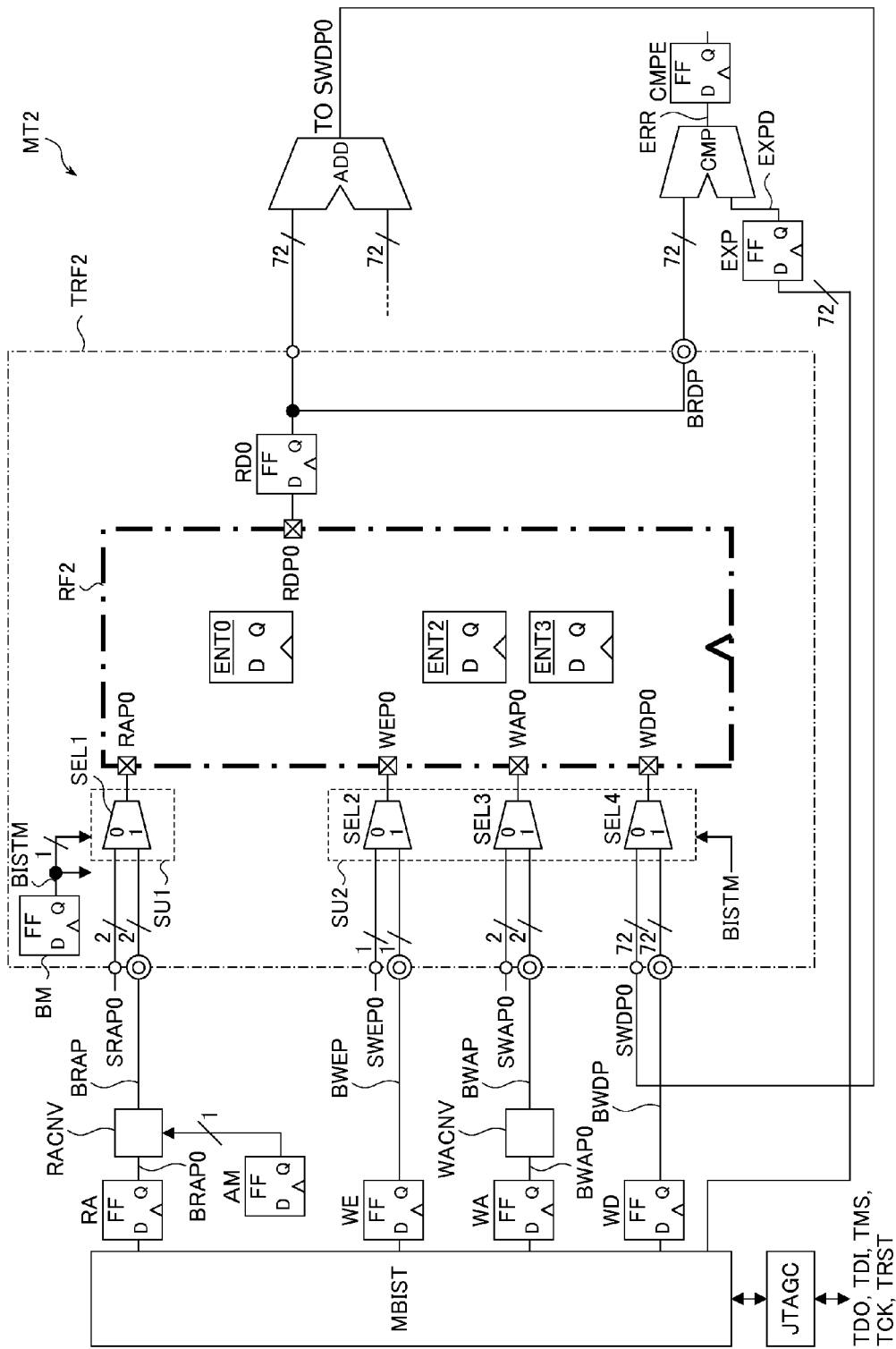
FIG. 16 is a diagram depicting another example of the memory test circuit.

Incidentally, the memory test circuit MT2 depicted in FIG. 11 may be provided to test a register file having one write data port WDP, one read data port RDP, and entries ENT0, ENT2, and ENT3. An example of the register file RF2 in this case is depicted in FIG. 16.

FIG. 12 depicts an example of the register file RF2 depicted in FIG. 11. The elements identical or similar to the elements depicted in FIG. 5 will be identified with the same characters, and their detailed explanations will be omitted.

The register file RF2 has a write control portion WCNT2 and the entries ENT0, ENT2, and ENT3 depicted in FIG. 11. Moreover, the register file RF2 has input selectors IS (IS0, IS2, and IS3) and output selectors OS (OS00, OS01, OS10, OS11, OS20, OS21, OS30, and OS31).

The write control portion WCNT2 outputs any one of selector control signals SC (SC0, SC2, and SC3) in accordance with a write address WAP (WAP0 or WAP1) corresponding to a write enable signal WEP indicating a valid level (for example, logic 1). Incidentally, since the register file RF2 does not include an entry ENT1, the write control portion WCNT2 does not generate the selector control signal SC1 depicted in FIG. 5. That is, the value "01" of the write address port WAP is treated as an invalid address.

A higher-order bit of each selector control signal SC is used to control the operation of enabling and disabling the input selector IS, and a lower-order bit of each selector control signal SC is used to select the input terminal of the input selector IS. As is the case with FIG. 5, the input selectors IS0, IS2, and IS3 operate based on the selector control signals SC. Then, data is written to the entry ENT0, ENT2, or ENT3 corresponding to the write address WAP.

The output selector OS01 selects two of the four pieces of data received by the input terminal in accordance with the value of the higher-order bit [1] of the read address RAP0, and outputs the selected two pieces of data to the output selector OS00. For example, as depicted in the output of the output selector OS01, if the higher-order bit [1] of the read address RAP is "1", the output selector OS01 selects the outputs of the entries ENT2 and ENT3. If the higher-order bit [1] of the read address RAP is "0", the output selector OS01 selects the outputs of the entries ENT0 and ENT2. That is, the output selector OS01 selects the entry ENT2 irrespective of the value of the higher-order bit [1] of the read address RAP.

The output selector OS00 selects any one of the two pieces of data received by the input terminal in accordance with the value of the lower-order bit [0] of the read address RAP0 and outputs the selected data to the read data port RDP0. Then, if the 2-bit read data port RDP0 is "00", the output selectors OS01 and OS00 output the data held by the entry ENT0; if the read data port RDP0 is "01" or "10", the output selectors OS01 and OS00 output the data held by the entry ENT2. Moreover, if the read data port RDP0 is "11", the output selectors OS01 and OS00 output the data held by the entry ENT3.

The configuration and operation of the output selectors OS11, OS21, and OS31 are the same as the configuration and operation of the output selector OS01, and the configuration and operation of the output selectors OS10, OS20, and OS30 are the same as the configuration and operation of the output selector OS00. The output selectors OS01, OS11, OS21, and OS31 are examples of a first selector that selects two of the pieces of data read from the four entries ENT based on a predetermined bit (for example, a higher-order bit [1]) of the read address RAP. The output selectors OS00, OS10, OS20, and OS30 are examples of a second selector that selects any one of the pieces of data selected by the output selectors OS01, OS11, OS21, and OS31.

FIG. 13 depicts an example of the operations of the read address conversion circuit RACNV and the write address conversion circuit WACNV depicted in FIG. 11. If the read address BRAP0 is "00", the read address conversion circuit RACNV outputs "00" to the read address port BRAP irrespective of the logic held in the latch circuit AM. If the read address BRAP0 is "10", the read address conversion circuit RACNV outputs "11" to the read address port BRAP irrespective of the logic held in the latch circuit AM.

If the read address BRAP0 is "01" and the latch circuit AM holds logic 0, the read address conversion circuit RACNV outputs "01" to the read address port BRAP. If the read address BRAP0 is "01" and the latch circuit AM holds logic 1, the read address conversion circuit RACNV outputs "10" to the read address port BRAP.

As described above, the read address conversion circuit RACNV converts the consecutive read addresses BRAP0 into the inconsecutive read addresses BRAP assigned to the entries ENT0, ENT2, and ENT3. As a result, it is possible to generate the inconsecutive read addresses BRAP by using the simpler test controlling portion MBIST (FIG. 6) than the test controlling portion MBIST0 depicted in FIG. 8. Moreover, the read address conversion circuit RACNV makes it possible to select the entry ENT2 to which the two read addresses "01" and "10" are assigned in accordance with the logic held in the latch circuit AM by using the two read addresses. As a result, by using the simple test controlling portion MBIST depicted in FIG. 6, it is possible to carry out a test on the entry ENT2 to which two read addresses are assigned.

If the write address BWAP0 is "00", the write address conversion circuit WACNV outputs "00" to the write address BWAP, and, if the write address BWAP0 is "01", the write address conversion circuit WACNV outputs "10" to the write address BWAP. If the write address BWAP0 is "10", the write address conversion circuit WACNV outputs "11" to the write address BWAP. That is, the write address conversion circuit WACNV converts the consecutive write addresses BWAP0 into the inconsecutive write addresses BWAP assigned to the entries ENT0, ENT2, and ENT3. As a result, it is possible to generate the inconsecutive write addresses BWAP by using the simpler test controlling portion MBIST (FIG. 6) than the test controlling portion MBIST0 depicted in FIG. 8.

Incidentally, if one read address BRAP is assigned to the entry ENT2, the memory test circuit MT2 depicted in FIG. 11 does not have the latch circuit AM or the logic held in the latch circuit AM is fixed. Moreover, if three or more read addresses BRAP are assigned to the entry ENT2, the latch circuit AM depicted in FIG. 11 holds a plurality of bits.

Figure 14:
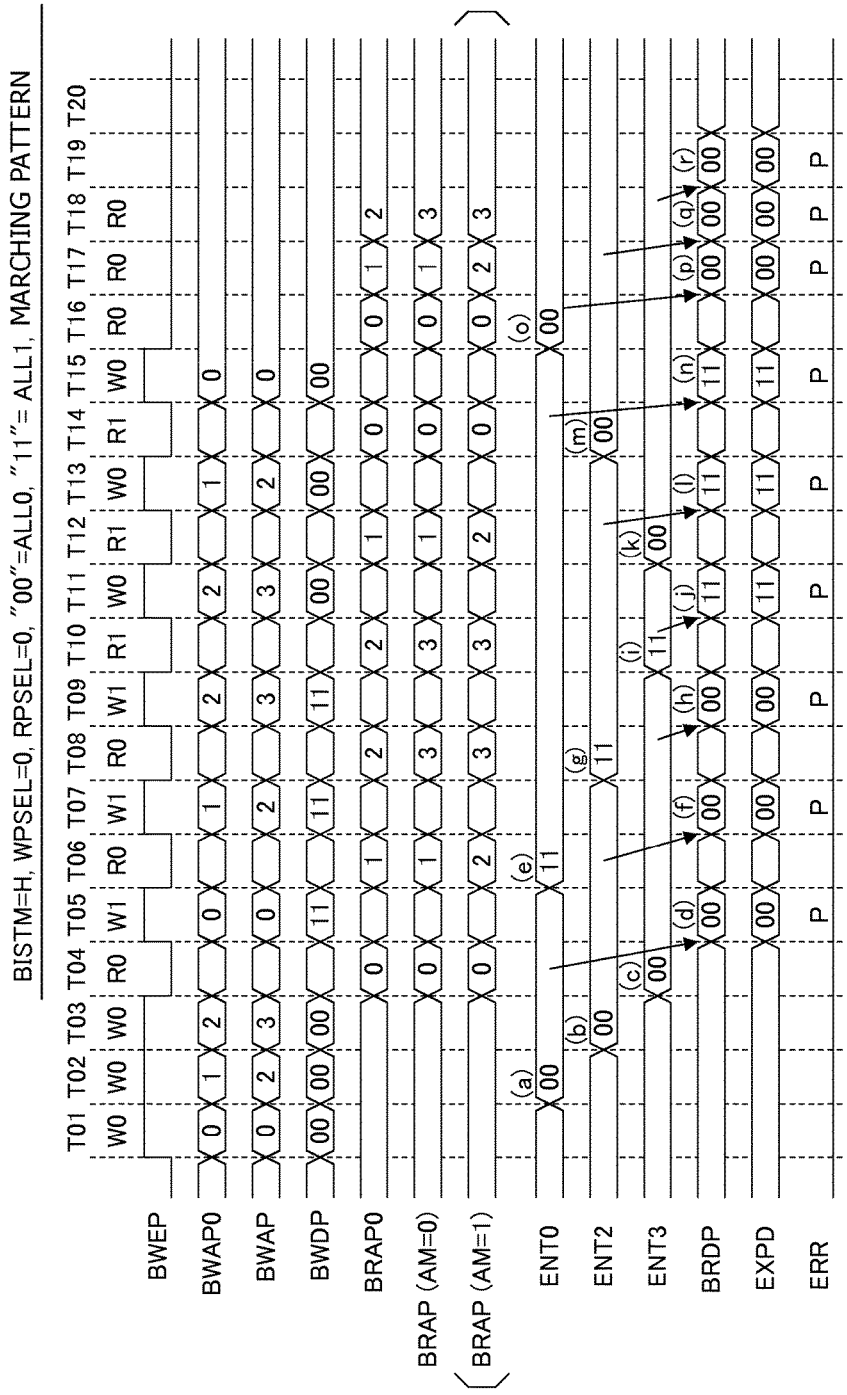
FIG. 14 is a diagram depicting an example in which the memory test circuit depicted in FIG. 11 tests the register file.

FIG. 14 depicts an example in which the memory test circuit MT2 depicted in FIG. 11 tests the register file RF2. That is, FIG. 14 depicts a method for controlling the memory test circuit MT2. For example, in FIG. 14, a test on signal lines and circuits which are coupled to the read address port RAP0, the write enable port WEP0, the write address port WAP0, the write data port WDP0, and the read data port RDP0 of the register file RF2 is carried out. The test is carried out by using a so-called marching pattern.

A pattern of the read address BRAP in brackets indicates the values generated by the read address conversion circuit RACNV when the latch circuit AM holds logic 1. For example, the memory test circuit MT2 sequentially sets logic 0 and logic 1 in the latch circuit AM and carries out the test depicted in FIG. 14.

A character "W0" written in FIG. 14 indicates a write command which is supplied to the register file TRF2 in order to write "ALL0" to the register file RF2. A character "W1" indicates a write command which is supplied to the register file TRF2 in order to write "ALL1" to the register file RF2. The write commands "W0" and "W1" differ from each other in the write data BWDP. Here, "ALL0" indicates that all the bits of the 72-bit write data BWDP are set to logic 0, and "ALL1" indicates that all the bits of the 72-bit write data BWDP are set to logic 1.

A character "R0" written in FIG. 14 indicates a read command which is supplied to the register file TRF2 in order to read an expected value "ALL0" from the register file RF2. A character "R1" indicates a read command which is supplied to the register file TRF2 in order to read an expected value "ALL1" from the register file RF2. The read commands "R0" and "R1" differ from each other in the expected value EXPD.

In the test which is carried out on the register file RF2, first, "ALL0" data is sequentially written to the entries ENT ((a), (b), and (c) of FIG. 14). In a write access, each entry ENT holds the write data BWDP in the clock cycle after the clock cycle in which the write enable signal BWEP, the write address BWAP, and the write data BWDP have been received.

Next, reading (R0) of "ALL0" data and writing (W1) of "ALL1" data are sequentially performed on each entry ENT ((d), (e), (f), (g), (h), and (i) of FIG. 14). In a read access, each entry ENT outputs the read data BRDP in the clock cycle after the clock cycle in which the read address BRAP has been received.

Next, reading (R1) of "ALL1" data and writing (W0) of "ALL0" data are sequentially performed on each entry ENT ((j), (k), (l), (m), (n), and (o) of FIG. 14). Next, reading of "ALL0" data is sequentially performed on each entry ENT ((p), (q), and (r) of FIG. 14).

The comparing portion CMP compares the read data BRDP with the expected value EXPD and outputs an error signal ERR. Since FIG. 14 depicts an example in which the register file RF2 operates normally and an error does not occur, the error signal ERR is maintained at logic 0. If the valid error signal ERR indicating the comparison result between the read data BRDP and the expected value EXPD is logic 0, the test controlling portion MBIST determines that the paths and circuits passed the test (P); if the valid error signal ERR is logic 1, the test controlling portion MBIST determines that the paths and circuits failed the test. That is, the test controlling portion MBIST determines whether the register file RF2 is good or not based on the comparison result obtained by the comparing portion CMP. Incidentally, for example, the test controlling portion MBIST determines that the clock cycles T01, T02, T03, T04, and T06 in which the expected value EXPD is not generated as an invalid cycle in which an invalid error signal ERR is output, and does not determine the test result in the invalid cycle. That is, a clock cycle in which the invalid error signal ERR is output is a clock cycle in which a comparison between the read data BRDP and the expected value EXPD is not performed.

Thereafter, a test similar to the test of FIG. 14 is carried out by using the other read address ports RAP1 to RAP3 and the other read data ports RDP1 to RDP3. Furthermore, a test similar to the test of FIG. 14 is carried out by using the other write enable port WEP1, write address port WAP1, and write data port WDP1. Then, the test carried out on the register file RF2 is completed.

Figure 15:
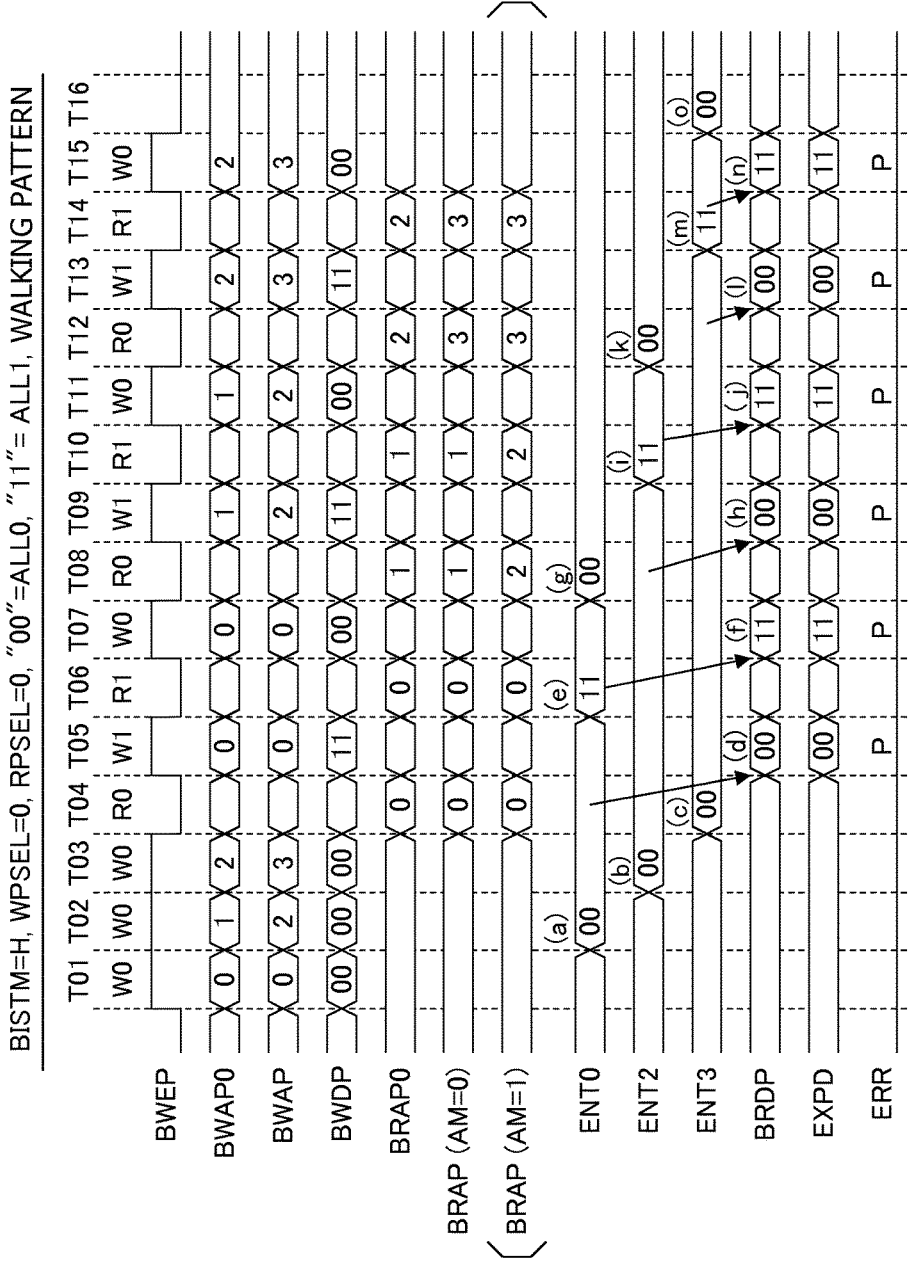
FIG. 15 is a diagram depicting another example in which the memory test circuit depicted in FIG. 11 tests the register file.

FIG. 15 depicts another example in which the memory test circuit MT2 depicted in FIG. 11 tests the register file RF2. That is, FIG. 15 depicts a method for controlling the memory test circuit MT2. The detailed explanations of the operations identical or similar to the operations depicted in FIG. 14 will be omitted. In the following description, writing of "ALL0" data is referred to as writing W1 and writing of "ALL1" data is referred to as writing W1. Reading of "ALL0" data is referred to as reading R0 and reading of "ALL1" data is referred to as reading R1.

The test of FIG. 15 is carried out by using a so-called walking pattern. Moreover, in FIG. 15, a test on signal lines and circuits which are coupled to the read address port RAP0, the write enable port WEP0, the write address port WAP0, the write data port WDP0, and the read data port RDP0 of the register file RF2 is carried out.

In the test which is carried out on the register file RF2, first, writing W0 to each entry ENT is performed ((a), (b), and (c) of FIG. 15). Next, reading RO, writing W1, reading R1, and writing WO are sequentially performed on each entry ENT ((d), (e), (f), (g), (h), (i), (j), (k), (l), (m), (n), and (o) of FIG. 15).

As is the case with FIG. 14, the comparing portion CMP compares the read data BRDP with the expected value EXPD and outputs an error signal ERR. In FIG. 15, since the register file RF2 operates normally and an error does not occur, the test controlling portion MBIST determines whether or not the paths and circuits passed the test (P) for each reading of the read data BRDP. Incidentally, in FIG. 15, as is the case with FIG. 14, the test controlling portion MBIST does not determine the test result in an invalid cycle in which the expected value EXPD is not generated.

Thereafter, a test similar to the test of FIG. 15 is carried out by using the other read address ports RAP1 to RAP3 and the other read data ports RDP1 to RDP3. Furthermore, a test similar to the test of FIG. 15 is carried out by using the other write enable port WEP1, write address port WAP1, and write data port WDP1. Then, the test carried out on the register file RF2 is completed.

FIG. 16 depicts another example of the memory test circuit. In the example depicted in FIG. 16, a register file RF2 which is tested by the memory test circuit MT2 is a single port type. That is, the register file RF2 has one read address port RAP0, one write enable port WEP0, one write address port WAP0, one write data port WDP0, and one read data port RDP0. As a result, the write control portion WCNT2 depicted in FIG. 12 determines an entry ENT to which data is written based on the write enable signal WEP0 and the write address WAP0. Moreover, the register file RF2 does not have the output selectors OS10, OS11, OS20, OS21, OS30, and OS31 depicted in FIG. 12.

The expanded register file TRF2 does not have the selectors SEL1 corresponding to the read data ports RDP1, RDP2, and RDP3 depicted in FIG. 11 and the latch circuits RD1, RD2, and RD3 corresponding to the read data ports RDP1, RDP2, and RDP3. Moreover, the register file TRF2 does not have the selector SEL2 corresponding to the write enable port WEP1 depicted in FIG. 11, the selector SEL3 corresponding to the write address port WAP1, and the selector SEL4 corresponding to the write data port WDP1. Furthermore, the register file TRF2 does not have the latch circuits WPS and RPS and the selector DSEL which are depicted in FIG. 11.

An example of the operation of the memory test circuit MT2 depicted in FIG. 16 is similar to the operations depicted in FIGS. 14 and 15. That is, the memory test circuit MT2 depicted in FIG. 16 is capable of generating inconsecutive read addresses BRAP by using the simple test controlling portion MBIST (FIG. 6) and carrying out a test on the entry ENT2 to which two read addresses are assigned. Moreover, the memory test circuit MT2 depicted in FIG. 16 is capable of generating inconsecutive write addresses BWAP by using the simple test controlling portion MBIST (FIG. 6).

Incidentally, the memory test circuit MT2 is capable of testing a register file having one write data port WDP and a plurality of read data ports RDP. Moreover, the memory test circuit MT2 is capable of testing a register file having a plurality of write data ports WDP and one read data port RDP.

Figure 17:
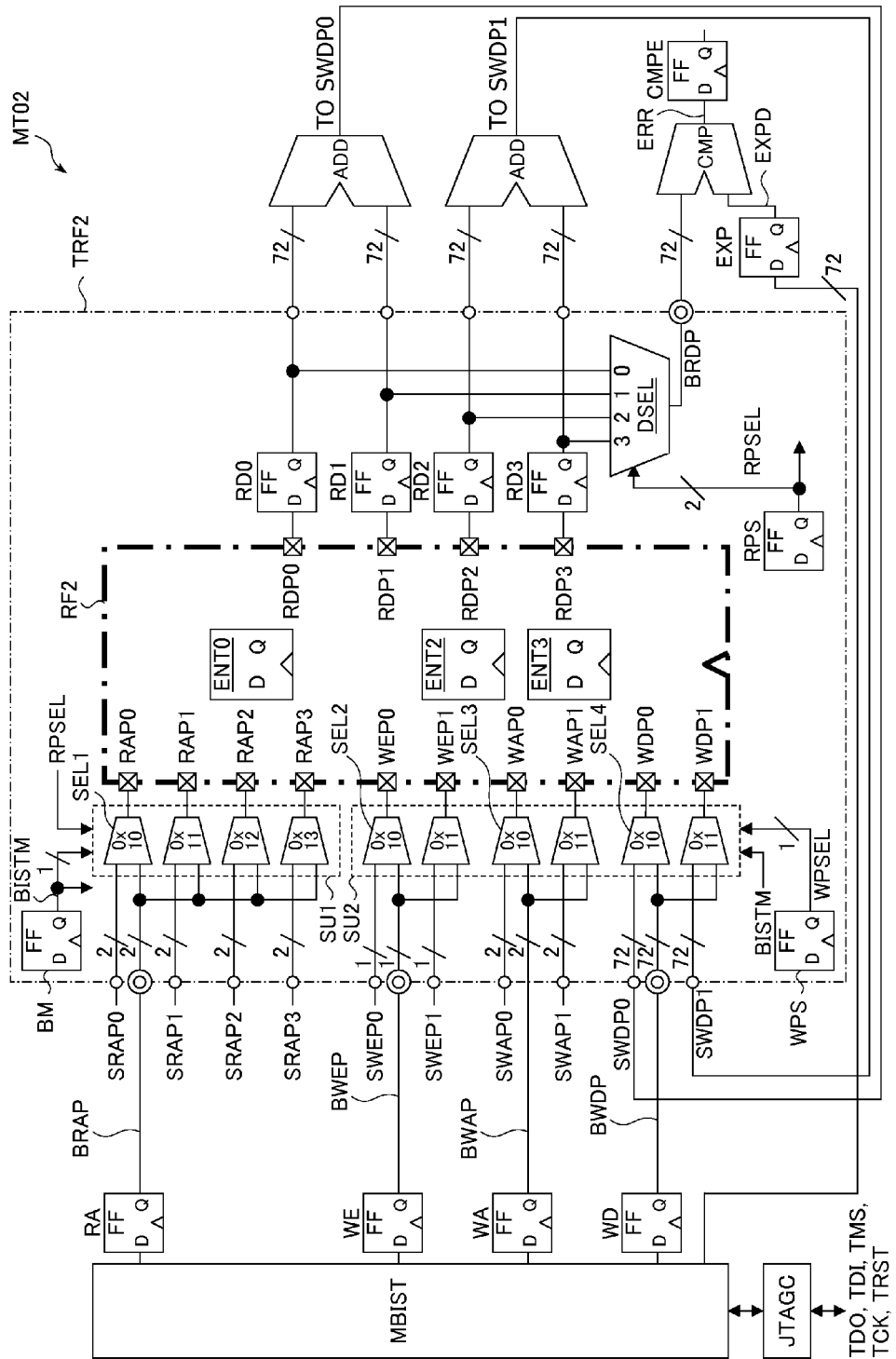
FIG. 17 is a diagram depicting still another example of the memory test circuit.

FIG. 17 depicts still another example of the memory test circuit. The elements identical or similar to the elements depicted in FIG. 11 will be identified with the same characters, and their detailed explanations will be omitted. An expanded register file TRF2 including a register file RF2 and part of the test circuit has the same or similar configuration as the configuration of FIG. 11. That is, the register file RF2 has three entries ENT0, ENT2, and ENT3, two write data ports WDP0 and WDP1, and four read data ports RDP0 to RDP3. The memory test circuit MT02 depicted in FIG. 17 does not have the read address conversion circuit RACNV, the latch circuit AM, and the write address conversion circuit WACNV which are depicted in FIG. 11. The latch circuit RA outputs the read address BRAP, and the latch circuit WA outputs the write address BWAP. The other configuration of the memory test circuit MT02 is similar to the configuration of the memory test circuit MT2 depicted in FIG. 11.

Figure 18:
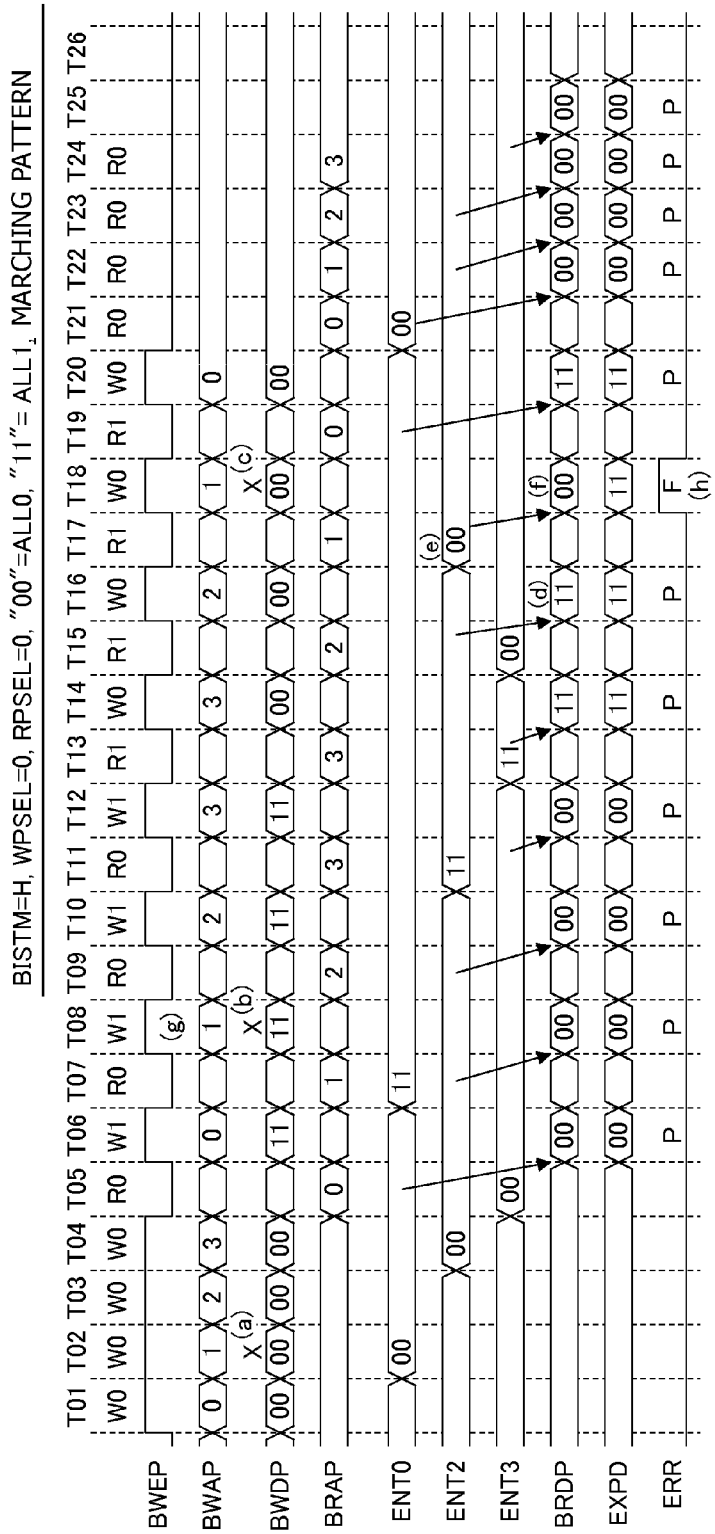
FIG. 18 is a diagram depicting an example in which the memory test circuit depicted in FIG. 17 tests the register file.

FIG. 18 depicts an example in which the memory test circuit MT02 depicted in FIG. 17 tests the register file RF2. The detailed explanations of the operations identical or similar to the operations depicted in FIG. 14 will be omitted. As is the case with FIG. 14, the test of FIG. 18 is carried out by using a so-called marching pattern.

The test controlling portion MBIST (FIG. 6) depicted in FIG. 17 has the function of sequentially generating the read address BRAP and the write address BWAP. As a result, the read address BRAP and the write address BWAP are sequentially generated as follows: "0", "1", "2", and "3" or "3", "2", "1", and "0". An entry ENT corresponding to the "1" write address BWAP does not exist. Therefore, the write data BWDP generated along with the "1" write address BWAP is not written to any entry ENT as indicated by "X" ((a), (b), and (c) of FIG. 18). Moreover, since the register file RF2 has the structure depicted in FIG. 12, a common entry ENT2 is selected by the "1" and "2" read addresses RAP (that is, BRAP of FIG. 18).

The memory test circuit MT02 reads "ALL1" data from the entry ENT2 which is selected by the "2" read address BRAP in clock cycles T15 and T16 ((d) of FIG. 18). Next, the memory test circuit MT02 writes "ALL0" data to the entry ENT2 which is selected by the "2" write address BWAP in clock cycles T16 and T17 ((e) of FIG. 18).

Next, the memory test circuit MT02 reads data from the entry ENT2 which is selected by the "1" read address BRAP in clock cycles T17 and T18 ((f) of FIG. 18). On the other hand, the memory test circuit MT02 generates a test pattern writing "ALL1" data to the "1" write address BWAP in a clock cycle T08 ((g) of FIG. 18). As a result, the memory test circuit MT02 sets, to "ALL1", the expected value of the data which is read from the entry ENT (actually ENT2) to which the "1" read address BRAP is assigned. Since the read data BRDP (="ALL0") read from the entry ENT2 is different from the expected value EXPD (="ALL1"), the comparing portion CMP sets the error signal ERR to logic 1 indicating that the paths and circuits failed the test ((h) of FIG. 18). That is, despite the normal operation of the register file RF2, the memory test circuit MT02 determines that the register file RF2 does not operate normally.

Figure 19:
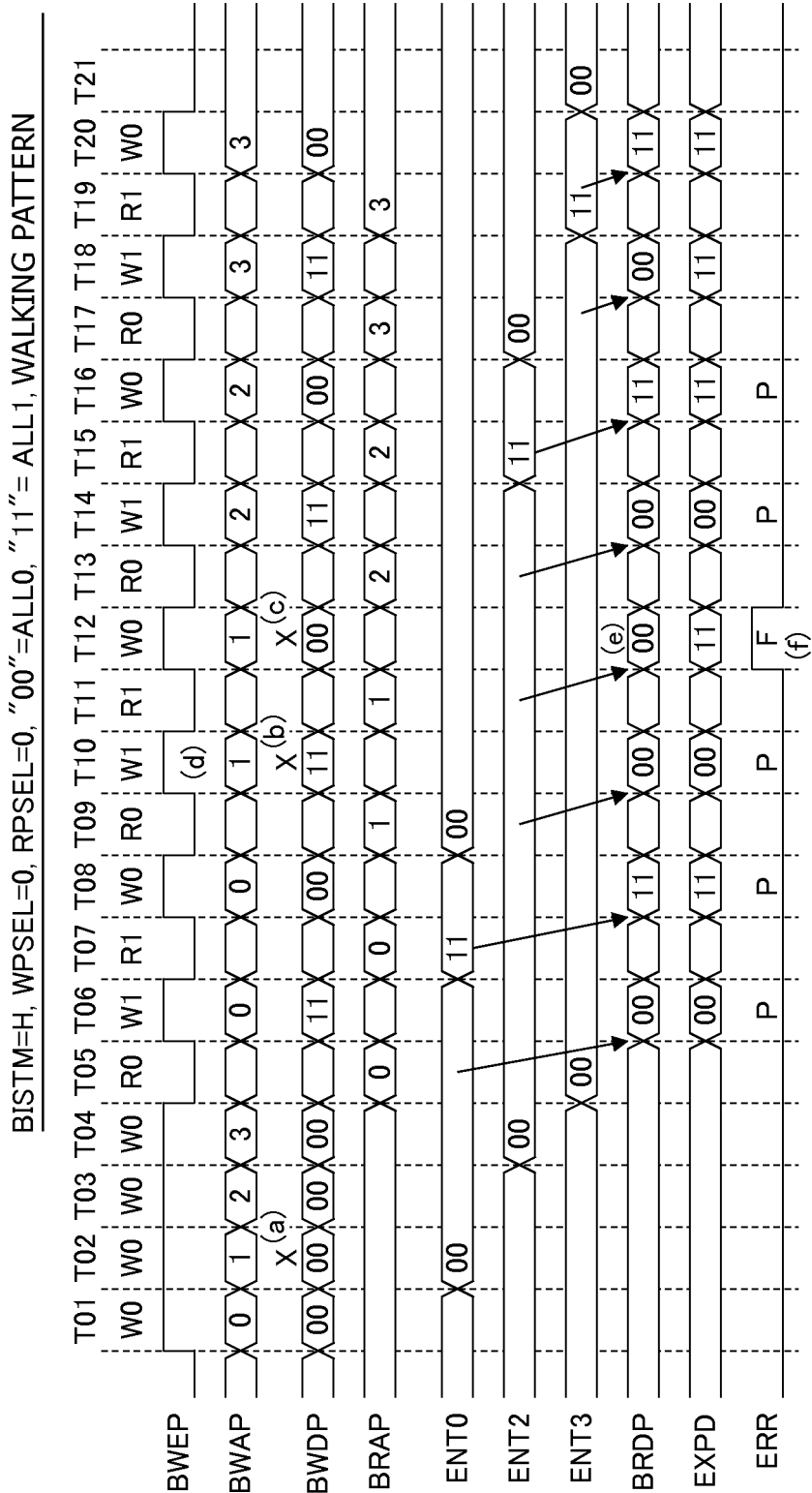
FIG. 19 is a diagram depicting another example in which the memory test circuit depicted in FIG. 17 tests the register file.

FIG. 19 depicts another example in which the memory test circuit MT02 depicted in FIG. 17 tests the register file RF2. The detailed explanations of the operations identical or similar to the operations depicted in FIGS. 14, 15, and 18 will be omitted. As is the case with FIG. 15, the test of FIG. 19 is carried out by using a so-called walking pattern.

As is the case with FIG. 18, the write data BWDP which is generated along with the "1" write address BWAP is not written to any entry ENT as indicated by "X" ((a), (b), and (c) of FIG. 19).

The memory test circuit MT02 generates a test pattern writing "ALL1" data to the "1" write address BWAP in a clock cycle T10 ((d) of FIG. 19). Therefore, as is the case with FIG. 18, the memory test circuit MT02 sets, to "ALL1", the expected value of data which is read from the entry ENT (actually ENT2) to which the "1" read address BRAP is assigned. Incidentally, as is the case with FIG. 14, the test controlling portion MBIST does not determine the test result in an invalid cycle in which the expected value EXPD is not generated.

Next, the memory test circuit MT02 reads "ALL0" data from the entry ENT2 which is selected by the "1" read address BRAP in clock cycles T11 and T12 ((e) of FIG. 19). However, since the read data BRDP (="ALL0") read from the entry ENT2 is different from the expected value EXPD (="ALL1"), the comparing portion CMP sets the error signal ERR to logic 1 indicating that the paths and circuits failed the test ((f) of FIG. 19). That is, despite the normal operation of the register file RF2, the memory test circuit MT02 determines that the register file RF2 does not operate normally.

As described above, also in the embodiments depicted in FIGS. 11 to 19, as is the case with the embodiments depicted in FIGS. 1 to 10, it is possible to carry out a test on the register file RF2 by using the existing test controlling portion MBIST that tests a single-port register file. That is, it is possible to carry out a test by regarding the multiport register file RF2 as a single-port register file. As a result, as compared to a case in which a common read address BRAP, a common write enable signal BWEP, a common write address BWAP, and a common write data BWDP are not used, it is possible to reduce the circuit size of the memory test circuit MT2.

Furthermore, since the memory test circuit MT2 depicted in FIG. 11 has the read address conversion circuit RACNV and the write address conversion circuit WACNV, the memory test circuit MT2 is capable of generating inconsecutive read addresses BRAP and inconsecutive write addresses BWAP. Therefore, the memory test circuit MT2 is capable of carrying out the test on the register file RF2 having the entries ENT to which the inconsecutive addresses are assigned by using the simple test controlling portion MBIST (FIG. 6). Moreover, since the memory test circuit MT2 has the latch circuit AM and the read address conversion circuit RACNV, the memory test circuit MT2 is capable of carrying out a test on the entry ENT2 to which two read addresses are assigned by using the simple test controlling portion MBIST (FIG. 6).

Figure 20:
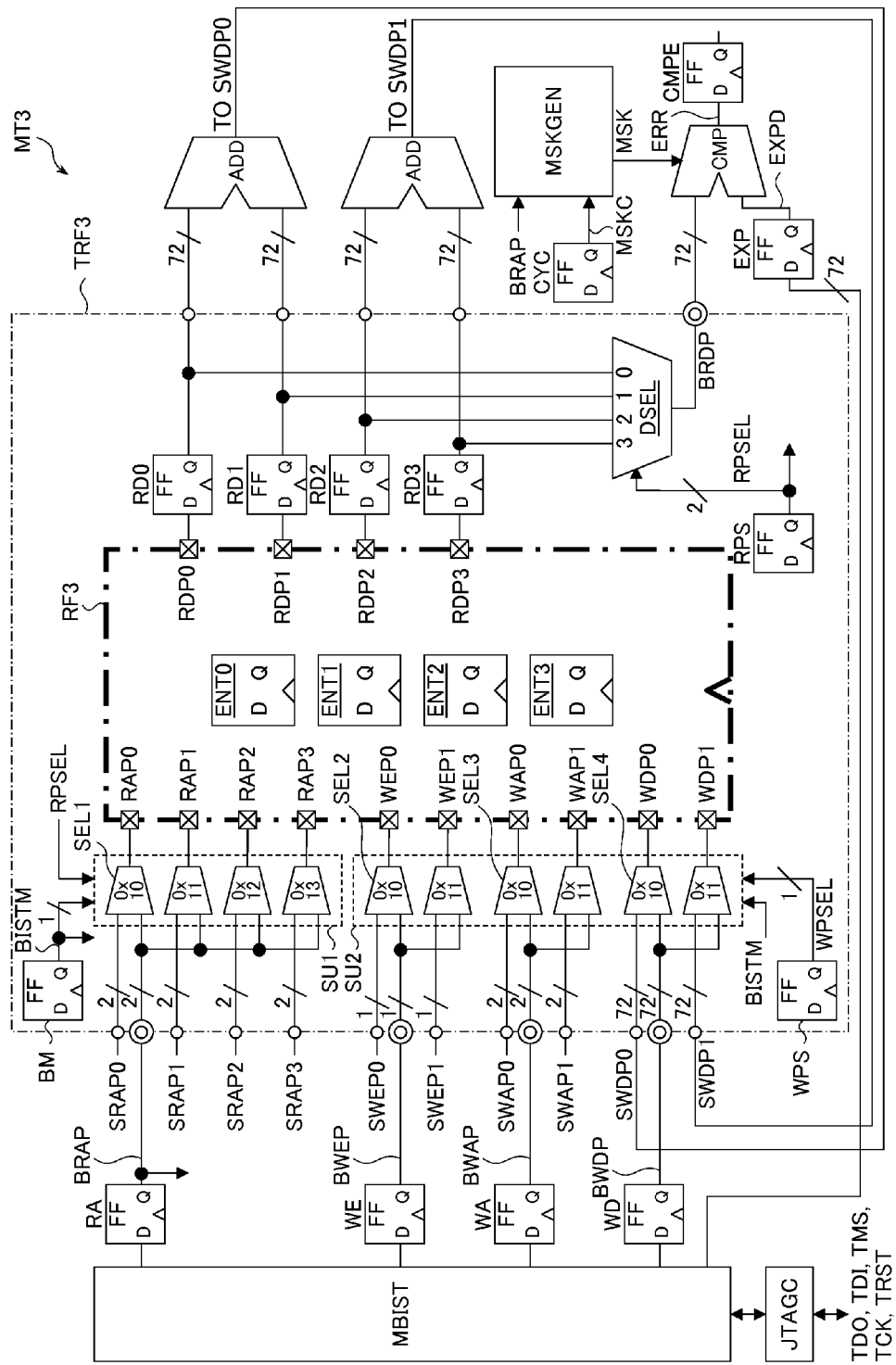
FIG. 20 is a diagram depicting another embodiment of the memory test circuit and the method for controlling the memory test circuit.

FIG. 20 depicts another embodiment of the memory test circuit and the method for controlling the memory test circuit. The elements identical or similar to the elements described in the embodiments depicted in FIGS. 4 to 19 will be identified with the same characters, and their detailed explanations will be omitted.

A memory test circuit MT3 depicted in FIG. 20 has an expanded register file TRF3 in place of the expanded register file TRF1 depicted in FIG. 4. The expanded register file TRF3 has a register file RF3. The register file RF3 is an example of the memory circuit, and entries ENT (ENT0, ENT1, ENT2, and ENT3) are examples of the storing portion. Moreover, the memory test circuit MT2 has a latch circuit CYC and a mask generation circuit MSKGEN. The other configuration of the memory test circuit MT3 is the same as the configuration of the memory test circuit MT1 depicted in FIG. 4.

The latch circuit CYC is reset to logic 0 when the worst read access cycle of the register file RF3 is 2 clock cycle and is reset to logic 1 when the worst read access cycle of the register file RF3 is 1 clock cycle. The latch circuit CYC outputs a mask control signal MSKC with the logic held thereby. For example, the latch circuit CYC is set by using boundary scan at the time of a BIST. The latch circuit CYC is an example of a suppression holding portion that holds the mask control signal MSKC suppressing the generation of a mask signal MSK by the mask generation circuit MSKGEN. The mask control signal MSKC is an example of suppression information.

Figure 22:
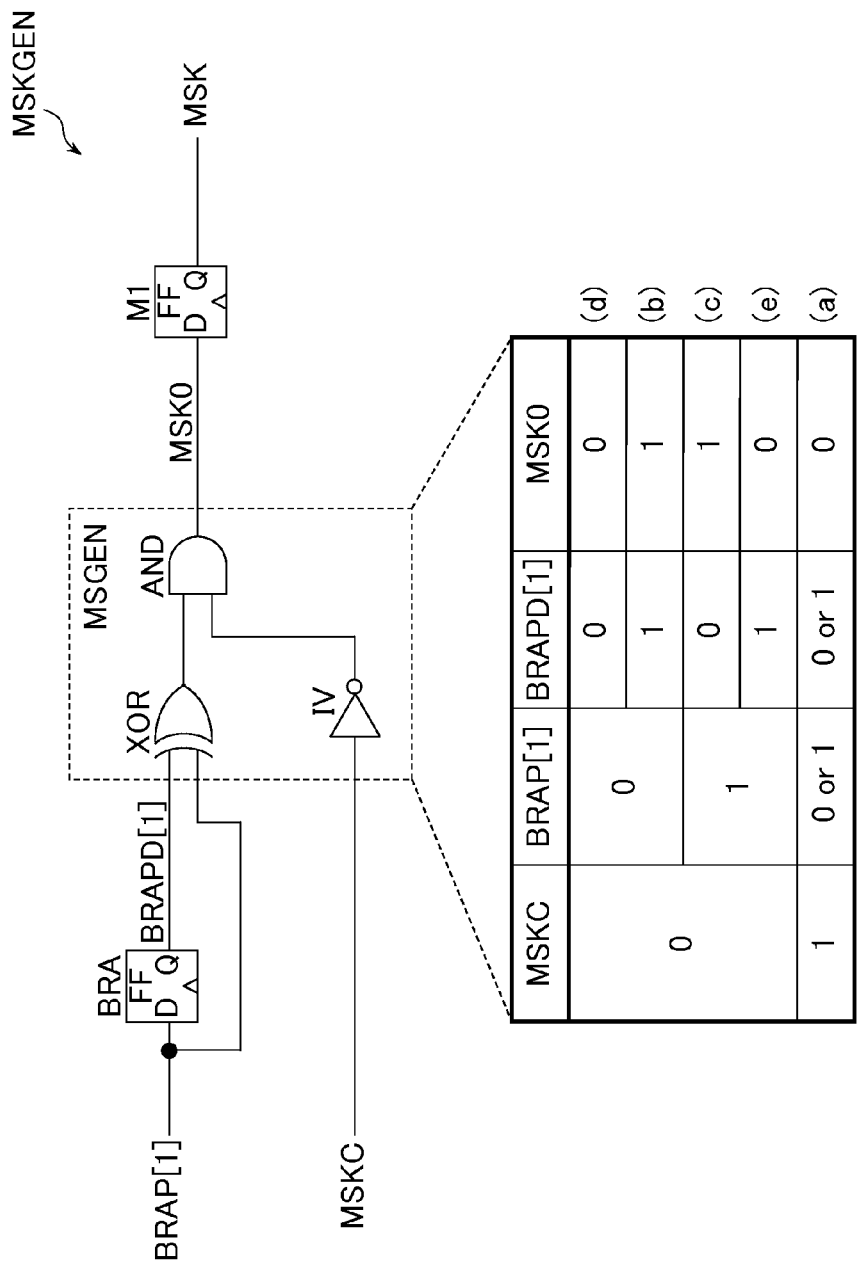
FIG. 22 is a diagram depicting an example of a mask generation circuit depicted in FIG. 20.

If the mask control signal MSKC is logic 0, the mask generation circuit MSKGEN generates, in accordance with the value of the read address BRAP, a mask signal MSK (for example, 1 bit) that disables the comparison result obtained by the comparing portion CMP. The mask generation circuit MSKGEN is an example of a detecting portion that detects a test pattern of the read address BRAP with which the time at which the read data BRDP is output becomes later than other times at which the read data BRDP is output. An example of the mask generation circuit MSKGEN is depicted in FIG. 22.

For example, the comparing portion CMP generates a 2-bit error signal ERR. The higher-order bit of the error signal ERR indicates the logic of the mask signal MSK, and the lower-order bit of the error signal ERR indicates the result of a comparison between the read data BRDP and the expected value EXPD. If the higher-order bit of the error signal ERR is logic 0, the test controlling portion MBIST determines whether the paths and circuits passed or failed the test based on the result of a comparison between the read data BRDP and the expected value EXPD. On the other hand, if the higher-order bit of the error signal ERR is logic 1, the test controlling portion MBIST ignores the lower-order bit of the error signal ERR and does not determine whether the paths and circuits passed or failed the test based on the result of a comparison between the read data BRDP and the expected value EXPD.

For example, the memory test circuit MT3 tests the register file RF3 provided in a CPU core which is incorporated into a semiconductor integrated circuit. For example, the memory test circuit MT3 is incorporated into a semiconductor integrated circuit (for example, a semiconductor chip) along with the register file RF3.

As is the case with the register file RF1 depicted in FIG. 4, the register file RF3 has four entries ENT0, ENT1, ENT2, and ENT3. However, the register file RF3 differs from the register file RF1 whose read access cycle is 1 clock cycle in that the worst read access cycle of the register file RF3 is 2 clock cycle and the best read access cycle of the register file RF3 is 1 clock cycle. For example, the worst read access cycle varies depending on the internal configuration of the register file RF3 and a clock frequency. An example of the internal configuration of the register file RF3 is depicted in FIG. 21.

Figure 21:
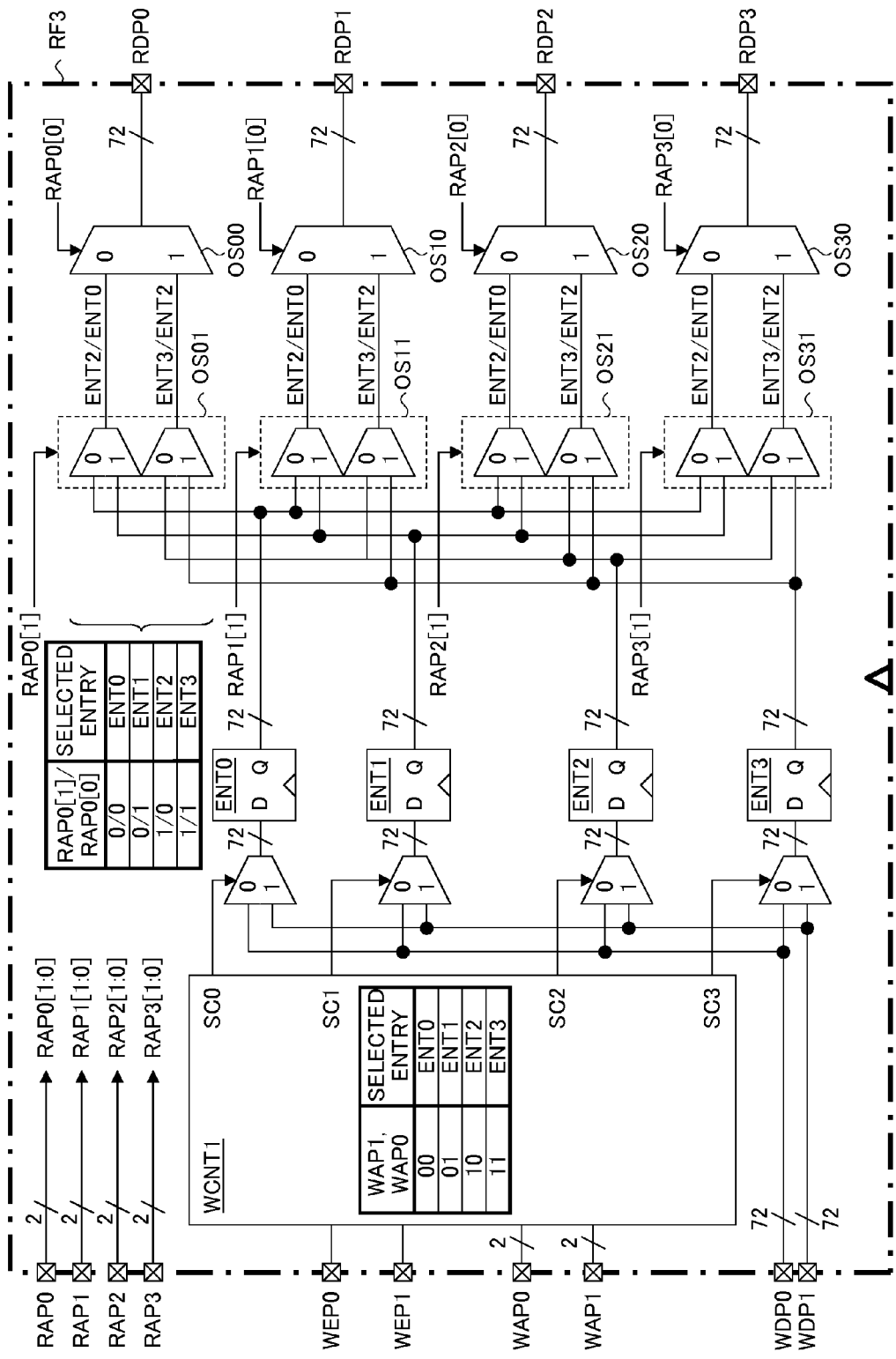
FIG. 21 is a diagram depicting an example of the register file depicted in FIG. 20.

FIG. 21 depicts an example of the register file RF3 depicted in FIG. 20. The elements identical or similar to the elements depicted in FIGS. 5 and 12 will be identified with the same characters, and their detailed explanations will be omitted.

The register file RF3 has the write control portion WCNT1 and the input selectors IS (IS0, IS1, IS2, and IS3) depicted in FIG. 5. Moreover, the register file RF3 has the output selectors OS (OS00, OS01, OS10, OS11, OS20, OS21, OS30, and OS31) depicted in FIG. 12. However, the coupling specifications between the output terminal Q of each entry ENT and the input terminals of the output selectors OS01, 0S11, OS21, and OS31 are different from the coupling specifications of the register file RF2 depicted in FIG. 12.

For example, the output selectors OS01 and OS00 output data held in the entries ENT whose numbers are the same as the address values indicated by the read addresses RAP0[1] and RAP0[0]. Here, the read address RAP0[1] is the higher-order bit of the read address RAP0, and the read address RAP0[0] is the lower-order bit of the read address RAP0. The other output selectors OS (a pair of OS10 and OS11, a pair of OS20 and OS21, and a pair of OS30 and OS31) operate in a manner similar to the output selectors OS01 and OS00.

FIG. 22 is an example of the mask generation circuit MSKGEN depicted in FIG. 20. The mask generation circuit MSKGEN has a latch circuit BRA, a mask signal generation circuit MSGEN, and a latch circuit M1. Incidentally, the latch circuit M1 is provided to match the clock cycle with which the mask signal MSK is output with the clock cycle with which the read data BRDP depicted in FIG. 20 is output and may be disposed outside the mask generation circuit MSKGEN.

The latch circuit BRA generates a read address BRAPD[1] obtained by delaying the higher-order bit BRAP[1] of the read address BRAP by 1 clock cycle. The mask signal generation circuit MSGEN has an exclusive OR gate XOR, an inverter IV, and an AND gate AND.

The mask signal generation circuit MSGEN is disabled if the mask control signal MSKC is logic 1 and sets the mask signal MSK0 to logic 0 ((a) of FIG. 22). The mask signal generation circuit MSGEN is enabled if the mask control signal MSKC is logic 0. Then, if the mask control signal MSKC is logic 0 and the logic of the read address BRAP[1] is different from the logic of the read address BRAPD[1], the mask signal generation circuit MSGEN sets the mask signal MSK0 to logic 1 ((b) and (c) of FIG. 22). On the other hand, if the read addresses BRAP[1] and BRAPD[1] have the same logic, the mask signal generation circuit MSGEN sets the mask signal MSK0 to logic 0 ((d) and (e) of FIG. 22). Moreover, the latch circuit M1 generates a mask signal MSK obtained by delaying the logic of the mask signal MSK0 by 1 clock cycle.

Figure 23:
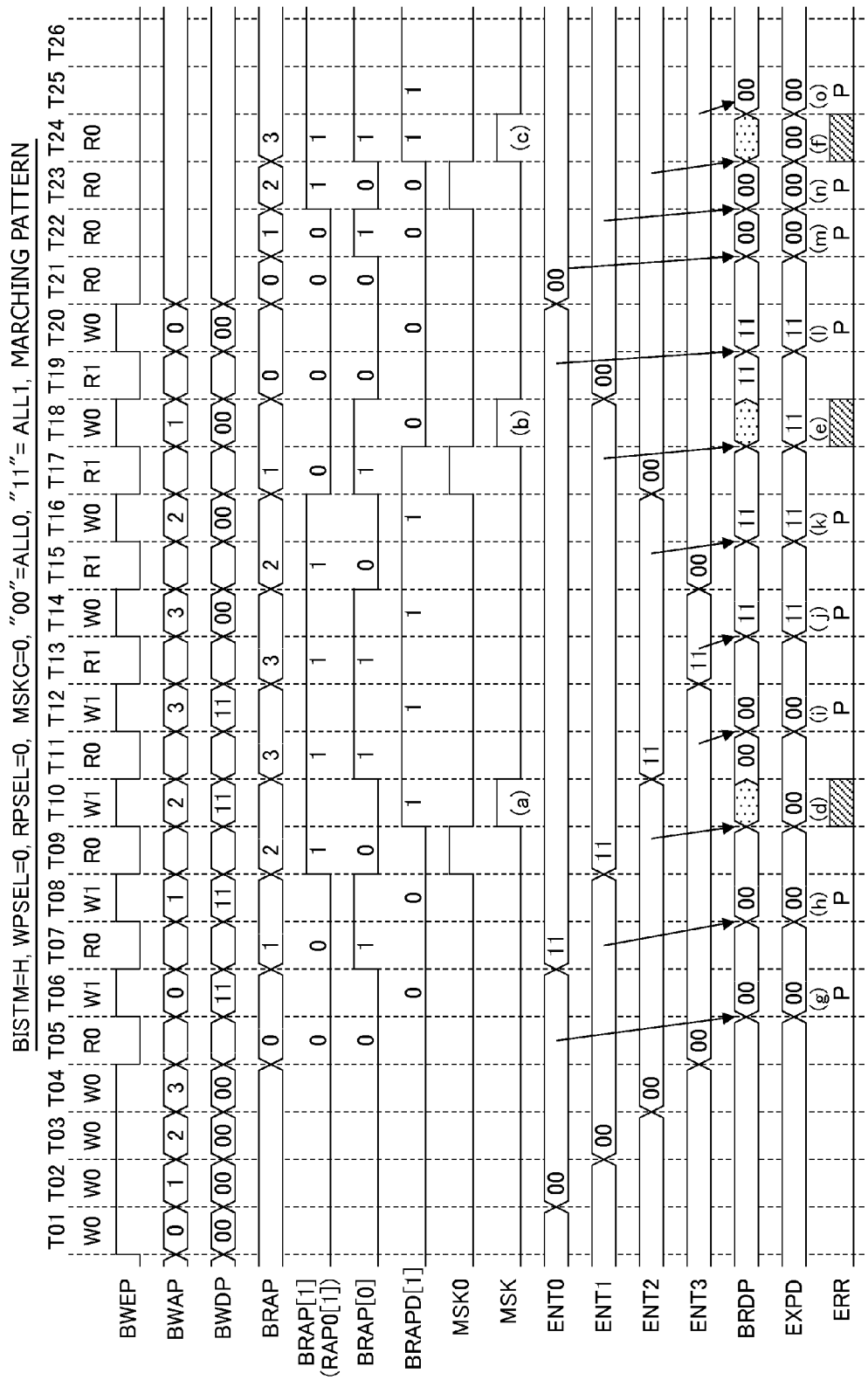
FIG. 23 is a diagram depicting an example in which the memory test circuit depicted in FIG. 20 tests the register file.

FIG. 23 depicts an example in which the memory test circuit MT3 depicted in FIG. 20 tests the register file RF3. That is, FIG. 23 depicts a method for controlling the memory test circuit MT3. The detailed explanations of the operations identical or similar to the operations depicted in FIG. 18 will be omitted. As is the case with FIG. 18, the test of FIG. 23 is carried out by using a so-called marching pattern.

In FIG. 23, a test pattern which is input to the register file RF is similar to the test pattern depicted in FIG. 18. However, the worst read access cycle of the register file RF3 depicted in FIG. 21 is 2 clock cycle in the clock cycle (clock frequency) depicted in FIG. 23. As a result, the memory test circuit MT3 sets the mask control signal MSKC to logic 0 by using the latch circuit CYC depicted in FIG. 20.

For example, when the logic of the read address BRAP[1] (=RAP0[1]) changes and the read data RDP which is output from the output selector OS01 depicted in FIG. 21 changes, the read data BRDP (=RDP0) is not confirmed in 1 clock cycle. In FIG. 23, a shaded read data BRDP indicates that the value is not confirmed. Then, the mask signal MSK is output while the value is not confirmed ((a), (b), and (c) of FIG. 23).

When the mask signal MSK is output, as indicated by an area with oblique lines, an invalid error signal ERR is output and a comparison between the read data BRDP and the expected value EXPD is prohibited ((d), (e), and (f) of FIG. 23). As a result, it is possible to suppress a mismatch between the comparison results when the value of the read data BRDP is not confirmed and avoid the determination that the paths and circuits failed the test.

In a clock cycle in which an invalid error signal ERR is not output, the test controlling portion MBIST determines whether the register file RF3 is good or not based on the comparison result obtained by the comparing portion CMP ((g), (h), (i), (j), (k), (l), (m), (n), and (o) of FIG. 23). Incidentally, after a clock cycle T21, a write access cycle is not inserted between the read access cycles. As a result, even when the time at which the read data RDP that is output from the register file RF3 is output varies in response to the transition of the read address RAP, the memory test circuit MT3 is capable of carrying out a test on the register file RF3 without making an erroneous determination. Incidentally, for example, a test by a test pattern in which a determination as to whether the register file RF3 is good or not is masked by an invalid error signal ERR is carried out by FIG. 24.

Figure 24:
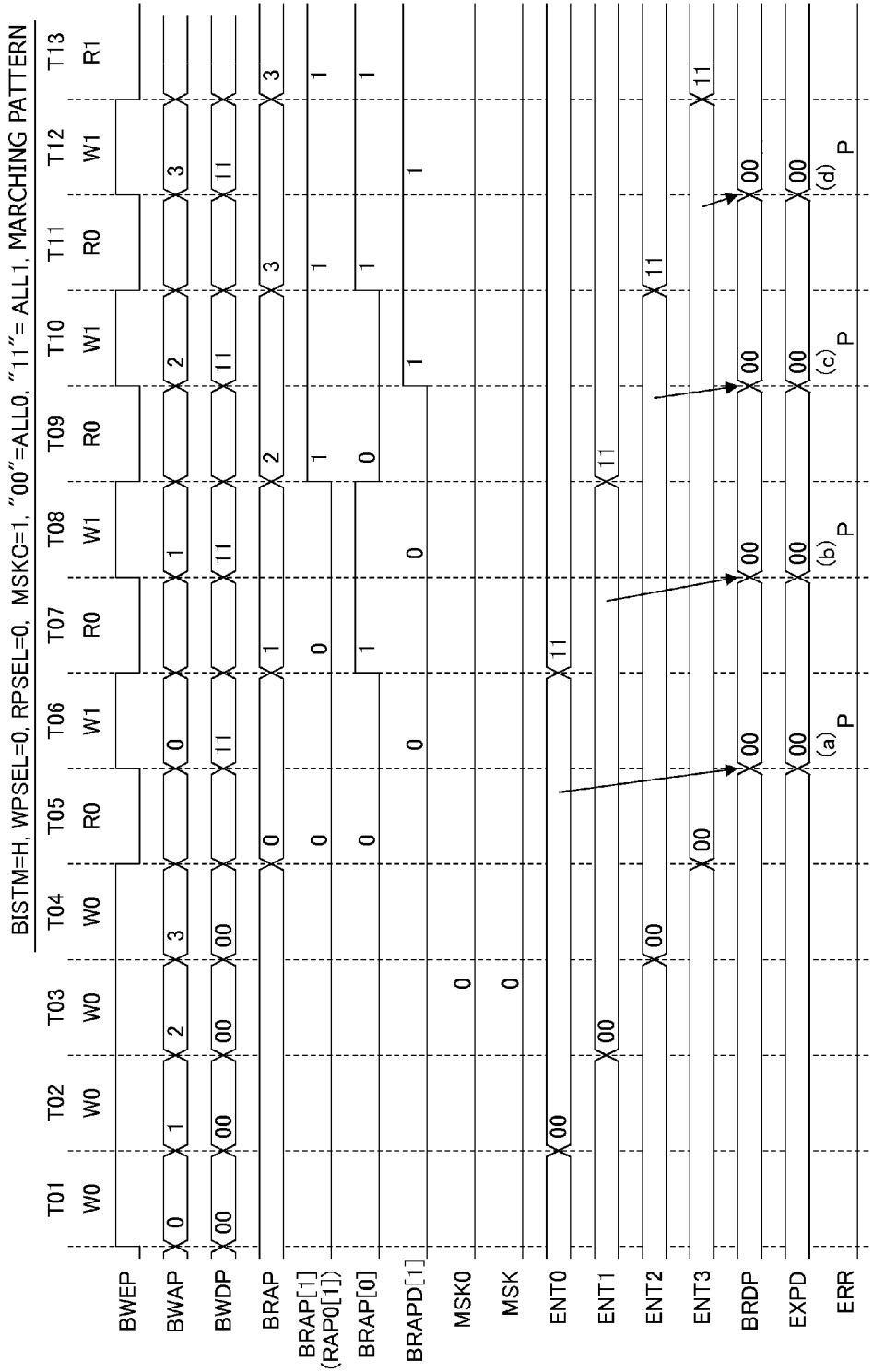
FIG. 24 is a diagram depicting another example in which the memory test circuit depicted in FIG. 20 tests the register file.

FIG. 24 depicts another example in which the memory test circuit MT3 depicted in FIG. 20 tests the register file RF3. That is, FIG. 24 depicts a method for controlling the memory test circuit MT3. The detailed explanations of the operations identical or similar to the operations depicted in FIGS. 14, 18, and 23 will be omitted. As is the case with FIGS. 18 and 23, the test of FIG. 24 is carried out by using a so-called marching pattern.

FIG. 24 is similar to FIG. 23 except that the clock frequency is set to ½ of the clock frequency of the test of FIG. 23. That is, the test pattern of FIG. 24 is similar to the test pattern of the clock cycles T01 to T13 of FIG. 23. The clock cycles T14 to T26 which are not depicted in FIG. 24 are similar to those of FIG. 23 except that the clock frequency is set to ½ of the clock frequency of the test of FIG. 23.

When the clock frequency is set to ½ of the clock frequency of FIG. 23, the read data BRDP (=RDP0) is confirmed in 1 clock cycle irrespective of whether or not the logic of the read address BRAP[1] (=RAP0[1]) changes. Therefore, the memory test circuit MT3 sets the mask control signal MSKC to logic 1 by using the latch circuit CYC depicted in FIG. 20 and prohibits the output of a mask signal MSK. As a result, a comparison between the read data BRDP and the expected value EXPD is performed in clock cycles of the first half ((a), (b), (c), and (d) of FIG. 24).

In a test in which the clock frequency is set to ½, by prohibiting the generation of the mask signal MSK, it is possible to evaluate the detailed circuit operations in a period during which a comparison is suppressed by the mask signal MSK in FIG. 23.

Figure 25:
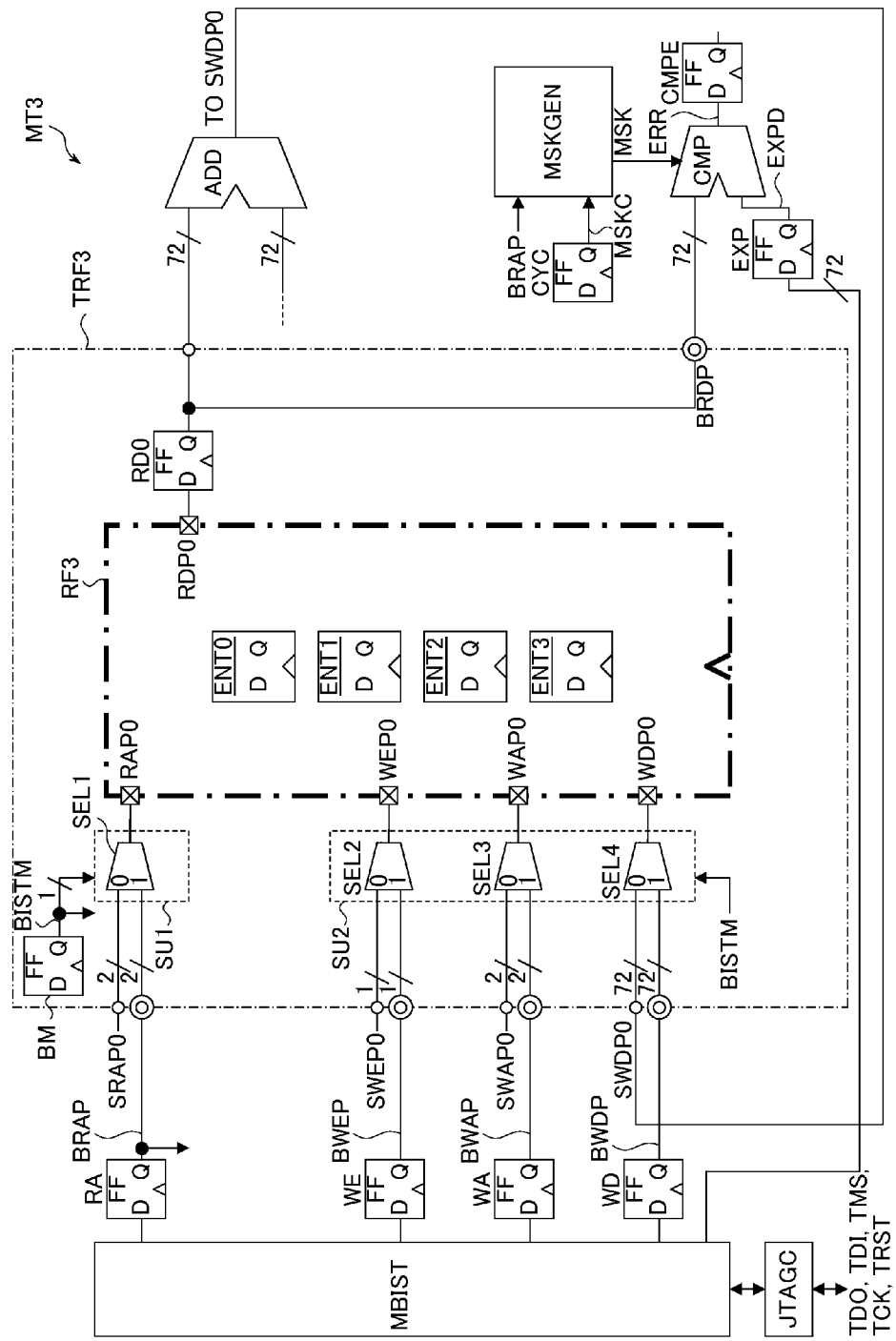
FIG. 25 is a diagram depicting another example of the memory test circuit.

FIG. 25 depicts another example of the memory test circuit. In the example depicted in FIG. 25, a register file RF3 which is tested by the memory test circuit MT2 is a single port type. That is, the register file RF3 has one read address port RAP0, one write enable port WEP0, one write address port WAP0, one write data port WDP0, and one read data port RDP0. Therefore, the write control portion WCNT1 depicted in FIG. 21 determines an entry ENT to which data is written based on the write enable signal WEP0 and the write address WAP0. Moreover, the register file RF3 does not have the output selectors OS10, OS11, OS20, OS21, OS30, and OS31 depicted in FIG. 21.

The expanded register file TRF3 does not have the selectors SEL1 corresponding to the read data ports RDP1, RDP2, and RDP3 depicted in FIG. 20 and the latch circuits RD1, RD2, and RD3 corresponding to the read data ports RDP1, RDP2, and RDP3. Moreover, the register file TRF3 does not have the selector SEL2 corresponding to the write enable port WEP1 depicted in FIG. 20, the selector SEL3 corresponding to the write address port WAP1, and the selector SEL4 corresponding to the write data port WDP1. Furthermore, the register file TRF3 does not have the latch circuits WPS and RPS and the selector DSEL which are depicted in FIG. 20.

An example of the operation of the memory test circuit MT3 depicted in FIG. 25 is similar to the operations of FIGS. 23 and 24. That is, even when the memory test circuit MT3 tests the register file RF2 having one write data port WDP0 and one read data port RDP0, the memory test circuit MT3 is capable of carrying out a test on the register file RF3 without making an erroneous determination. Moreover, by conducting a test in which the clock frequency is decreased and the generation of the mask signal MSK is prohibited, it is possible to evaluate the detailed circuit operations in a period during which a comparison is suppressed by the mask signal MSK in FIG. 23. Incidentally, the memory test circuit MT3 is capable of testing a register file having one write data port WDP and a plurality of read data ports RDP. Moreover, the memory test circuit MT3 is capable of testing a register file having a plurality of write data ports WDP and one read data port RDP.

As described above, also in the embodiments depicted in FIGS. 20 to 25, as is the case with the embodiments depicted in FIGS. 1 to 10, it is possible to carry out a test on the register file RF3 by using the existing test controlling portion MBIST that tests a single-port register file. That is, it is possible to carry out a test by regarding the multiport register file RF3 as a single-port register file. As a result, as compared to a case in which a common read address BRAP, a common write enable signal BWEP, a common write address BWAP, and a common write data BWDP are not used, it is possible to reduce the circuit size of the memory test circuit MT3.

Furthermore, in the embodiments depicted in FIGS. 20 to 25, by generating the mask signal MSK, the memory test circuit MT3 is capable of carrying out a test on the register file RF3 without making an erroneous determination. Moreover, by conducting a test in which the clock frequency is decreased and the generation of the mask signal MSK is prohibited, it is possible to evaluate the detailed circuit operations in a period during which a comparison is suppressed by the mask signal MSK in FIG. 23.

Figure 26:
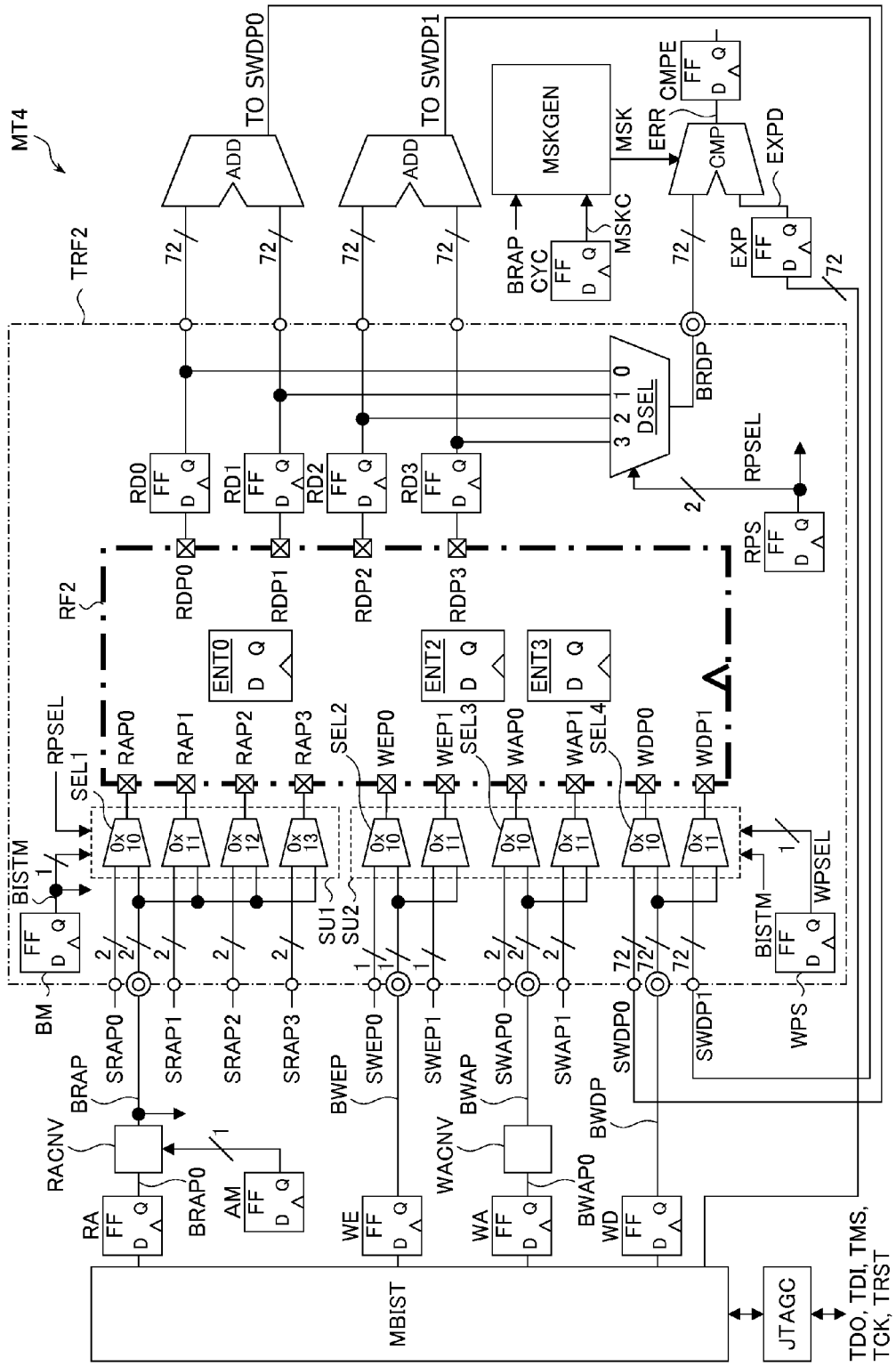
FIG. 26 is a diagram depicting another embodiment of the memory test circuit and the method for controlling the memory test circuit.

FIG. 26 depicts another embodiment of the memory test circuit and the method for controlling the memory test circuit. The elements identical or similar to the elements described in the embodiments depicted in FIGS. 11 to 25 will be identified with the same characters, and their detailed explanations will be omitted.

A memory test circuit MT4 depicted in FIG. 26 has a configuration obtained by adding the latch circuit CYC and the mask signal generation circuit MSGEN depicted in FIG. 20 to the memory test circuit MT2 depicted in FIG. 11. That is, the memory test circuit MT4 has the register file RF2 with three entries ENT0, ENT2, and ENT3 depicted in FIG. 12, the read address conversion circuit RACNV, and the write address conversion circuit WACNV.

Figure 27:
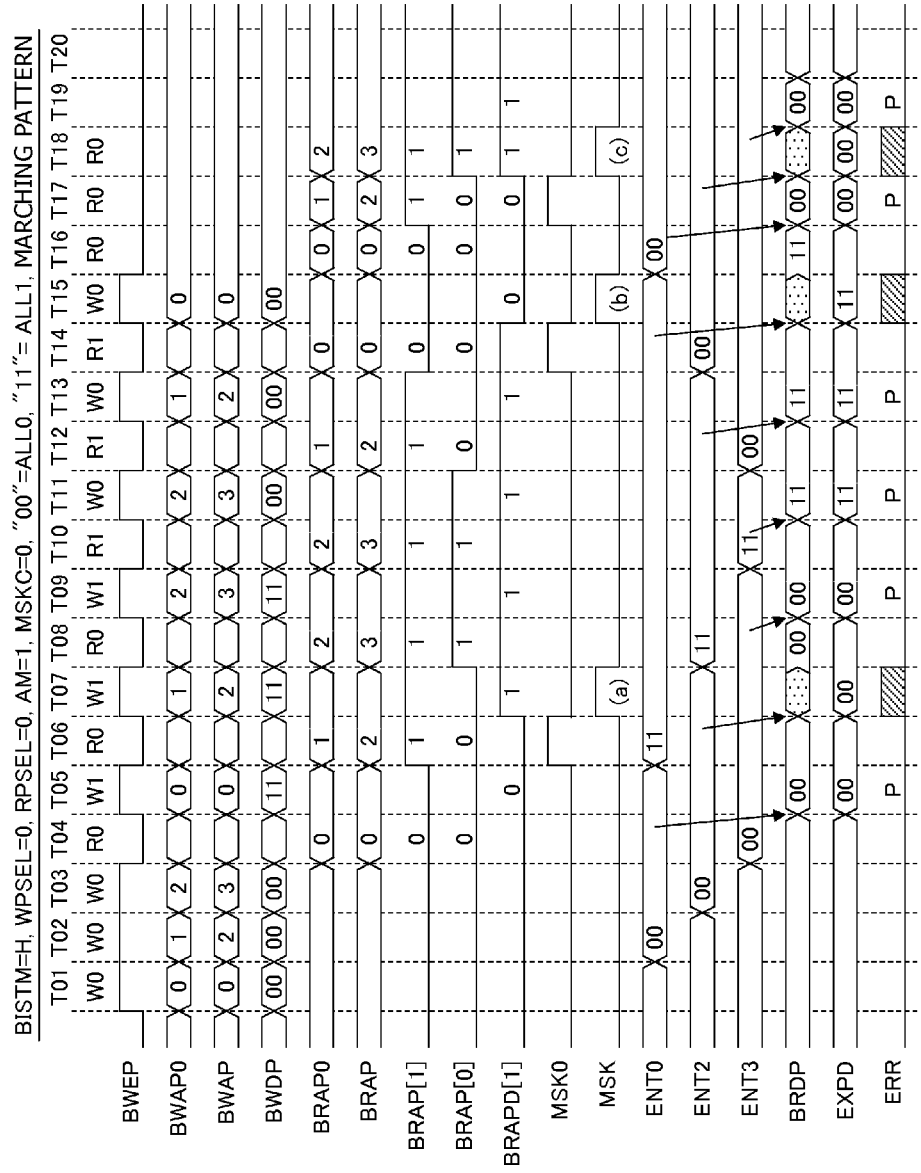
FIG. 27 is a diagram depicting an example in which the memory test circuit depicted in FIG. 26 tests the register file.

FIG. 27 depicts an example in which the memory test circuit MT4 depicted in FIG. 26 tests the register file RF2. That is, FIG. 27 depicts a method for controlling the memory test circuit MT4. The detailed explanations of the operations identical or similar to the operations depicted in FIGS. 14 and 23 will be omitted. As is the case with FIG. 14, the test of FIG. 27 is carried out by using a so-called marching pattern.

In FIG. 27, a test pattern which is input to the register file RF is similar to the test pattern depicted in FIG. 14. However, the worst read access cycle of the register file RF2 depicted in FIG. 12 is 2 clock cycle in a clock cycle (clock frequency) depicted in FIG. 27. Therefore, the memory test circuit MT4 sets the mask control signal MSKC to logic 0 by using the latch circuit CYC depicted in FIG. 26. The operation in the worst read access cycle is similar to the operation of FIG. 23. That is, in order to prohibit a comparison between the read data BRDP and the expected value EXPD in a shaded period in which the value of the read data BRDP is not confirmed, the mask signal MSK is output ((a), (b), and (c) of FIG. 27).

As a result, as is the case with FIG. 23, in a clock cycle in which an invalid error signal ERR indicated by an area with oblique lines is output, a comparison between the read data BRDP and the expected value EXPD is prohibited. The test controlling portion MBIST determines whether the register file RF2 is good or not based on the comparison result obtained by the comparing portion CMP in a clock cycle in which an invalid error signal ERR is not output. That is, even when the time at which the read data RDP that is output from the register file RF2 is output varies in response to the transition of the read address RAP, the memory test circuit MT4 is capable of carrying out a test on the register file RF2 without making an erroneous determination.

Incidentally, as is the case with FIG. 24, the operation performed when the clock frequency is set to ½ and the test of FIG. 27 is carried out is similar to the operation of FIG. 14. However, the clock frequency is set to be twice as high as the clock frequency of FIG. 14.

Figure 28:
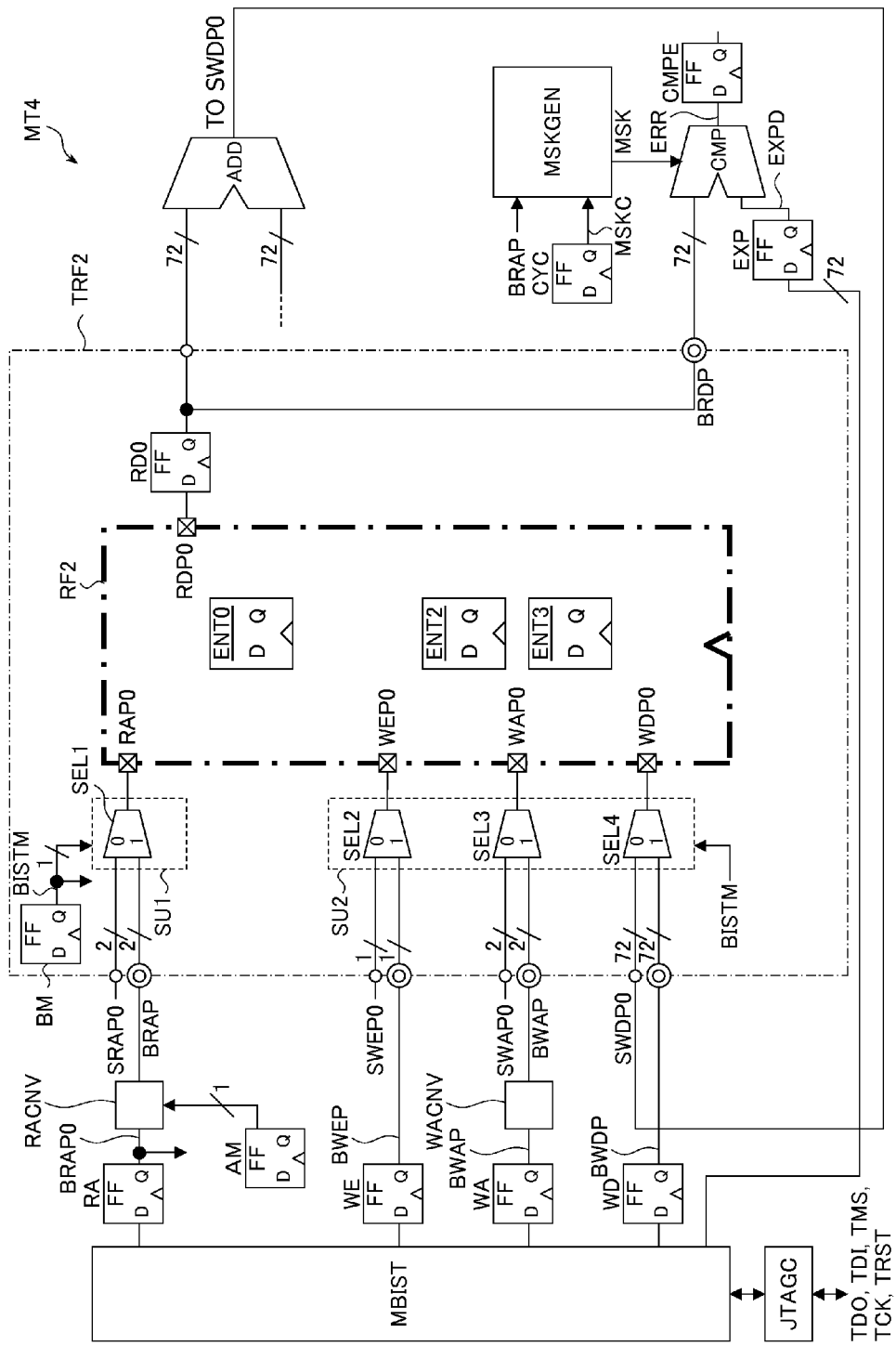
FIG. 28 is a diagram depicting another example of the memory test circuit.

FIG. 28 depicts another example of the memory test circuit. In the example depicted in FIG. 28, the register file RF2 which is tested by the memory test circuit MT4 is a single-port type and is identical or similar to the register file RF2 depicted in FIG. 16. Moreover, the expanded register file TRF2 is identical or similar to the register file TRF2 depicted in FIG. 16. In FIG. 28, the configuration of the portions other than the register file TRF2 is similar to the configuration of FIG. 26 except for the number of adders ADD.

As described above, also in the embodiments depicted in FIGS. 26 to 28, it is possible to obtain the same effects as the effects of the embodiments depicted in FIGS. 1 to 25. That is, it is possible to carry out a test on the register file RF4 by using the existing test controlling portion MBIST that tests a single-port register file. That is, it is possible to carry out a test by regarding the multiport register file RF4 as a single-port register file. As a result, as compared to a case in which a common read address BRAP, a common write enable signal BWEP, a common write address BWAP, and a common write data BWDP are not used, it is possible to reduce the circuit size of the memory test circuit MT4.

The presence of the memory test circuit MT4, the read address conversion circuit RACNV, and the write address conversion circuit WACNV makes it possible to generate inconsecutive read addresses BRAP and inconsecutive write addresses BWAP. Therefore, it is possible to carry out a test on the register file RF4 having entries ENT to which the inconsecutive addresses are assigned by using the memory test circuit MT4 and the simple test controlling portion MBIST (FIG. 6). Moreover, since the memory test circuit MT4 has the latch circuit AM and the read address conversion circuit RACNV, the memory test circuit MT4 is capable of carrying out a test on the entry ENT4 to which two read addresses are assigned by using the simple test controlling portion MBIST (FIG. 6).

The memory test circuit MT4 is capable of carrying out a test on the register file RF4 without making an erroneous determination by generating the mask signal MSK. Moreover, by conducting a test in which the clock frequency is decreased and the generation of the mask signal MSK is prohibited, it is possible to evaluate the detailed circuit operations in a period in which a comparison is suppressed by the mask signal MSK in FIG. 27.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A test circuit comprising:
 a control circuit that tests a memory having a plurality of data holding circuits holding data, a plurality of write ports being coupled to the plurality of data holding circuits and used for writing data to the plurality of data holding circuits, and a plurality of read ports being coupled to the plurality of data holding circuits and used for reading data held in the plurality of data holding circuits;

a write port identification information holding circuit that holds write port identification information identifying any one of the plurality of write ports;

a read port identification information holding circuit that holds read port identification information identifying any one of the plurality of read ports;

a write port selection circuit that selects any one of the plurality of write ports based on the write port identification information; and a read port selection circuit that selects any one of the plurality of read ports based on the read port identification information, wherein the control circuit sets the write port identification information in the write port identification information holding circuit and sets the read port identification information in the read port identification information holding circuit and carries out a test on the memory via the selected write port and the selected read port.

2. The test circuit according to claim 1, wherein inconsecutive addresses are assigned to the plurality of data holding circuits, the test circuit further includes an address generation circuit that generates consecutive addresses and an address conversion circuit that holds first information indicating a correlation between the consecutive addresses and the inconsecutive addresses, and the control circuit tests the data holding circuits based on the first information held by the address conversion circuit.

3. The test circuit according to claim 2, wherein to each of the plurality of data holding circuits, a write address indicating that the data holding circuit is a data holding circuit to which data is to be written and a read address indicating that the data holding circuit is a data holding circuit from which data is to be read are assigned, and, to any one of the plurality of data holding circuits, the read addresses are assigned, and the test circuit holds second information identifying any one of the plurality of read addresses, and the address conversion circuit creates the first information based on the second information.

4. The test circuit according to claim 1, wherein a timing at which data that is read from the memory differs depending on a test pattern of the read address, the test circuit includes a detection circuit that detects a first test pattern of a first read address with which a timing at which first data is output becomes later than a timing at which second data is output and a comparison circuit that disables a comparison between data and an expected value for a predetermined period of time from a start of reading of the data from the memory based on a detection by the detection circuit, and the control portion determines whether the memory is good or not based on a comparison result obtained by the comparison circuit.

5. The test circuit according to claim 1, wherein the control portion generates a write access signal writing data to the data holding circuit, a read access signal reading data from the data holding circuit, and an expected value, and compares data which is output from the memory based on the read access signal with the expected value.

6. The test circuit according to claim 4, further comprising:

an information holding circuit that holds third information suppressing the detection by the detection circuit, wherein when the third information is held in the information holding circuit, the detection circuit stops a detection of the first test pattern in which the timing at which the first data is output becomes later than the timing at which the second data is output.

7. The test circuit according to claim 4, wherein the memory includes a plurality of first selectors that select any one of pieces of data which are read from the plurality of data holding circuits based on a first bit of the read address and a second selector that selects any one of pieces of data selected by the plurality of first selectors based on a second bit of the read address, and the detection circuit detects a second test pattern in which the first bit of the read address that is used by the first selectors changes.

8. A test circuit that tests a memory including a plurality of data holding circuits that hold data and to which inconsecutive addresses are assigned, the test circuit comprising:

an address generation circuit that generates consecutive addresses;

an address conversion circuit that holds first information indicating a correlation between the consecutive addresses generated by the address generation circuit and the inconsecutive addresses assigned to the plurality of data holding circuits; and a control circuit that tests the memory based on the consecutive addresses generated by the address generation circuit and the first information.

9. The test circuit according to claim 8, wherein the control circuit generates a write access signal writing data to the data holding circuit, a read access signal reading data from the data holding circuit, and an expected value and compares data which is output from the memory based on the read access signal with the expected value.

10. The test circuit according to claim 8, wherein to each of the plurality of data holding circuits, a write address indicating that the data holding circuit is a data holding circuit to which data is to be written and a read address indicating that the data holding circuit is a data holding circuit from which data is to be read are assigned, and, to any one of the plurality of data holding circuits, the read addresses are assigned, the test circuit has an address holding circuit holding second information identifying any one of the plurality of read addresses, and the address conversion circuit creates first information indicating the correlation between the consecutive addresses and the inconsecutive addresses based on the second information held in the address holding circuit.

11. The test circuit according to claim 8, wherein a timing at which data that is read from the memory is output differs depending on a test pattern of the read address, the test circuit includes a detection circuit that detects a test pattern of the read address with which a timing at which first data is output becomes later than a timing at which second data is output and a comparison circuit that disables a comparison between data and an expected value for a predetermined period of time from a start of reading of the data from the memory based on a detection by the detection circuit, and the control circuit determines whether the memory is good or not based on a comparison result obtained by the comparison circuit.

12. A test circuit that tests a memory including a plurality of data holding circuits which store data, the memory in which a timing at which data is output differs depending on a test pattern of a read address identifying a data holding circuit of the plurality of data holding circuits, the data holding circuit from which data is to be read, the test circuit comprising:

a detection circuit that detects a first test pattern in which a timing at which first data is output becomes later than a timing at which second data is output;

a comparison circuit that disables a comparison between data and an expected value for a predetermined period of time from a start of reading of the data from the memory based on a detection by the detection circuit; and a control circuit that determines whether the memory is good or not based on a comparison result obtained by the comparison circuit.

13. The test circuit according to claim 12, further comprising:

an information holding circuit that holds third information suppressing a detection by the detection circuit, wherein when the third information is held in the information holding circuit, the detection circuit stops a detection of the first test pattern in which a timing at which the first data is output becomes later than a timing at which the second data is output.

14. The test circuit according to claim 12, wherein the memory includes a plurality of first selectors that select any one of pieces of data which are read from a predetermined number of the data holding circuits based on a first bit of the read address and a second selector that selects any one of pieces of data selected by the plurality of first selectors based on a second bit of the read address, and the detection circuit detects a second test pattern in which the first bit of the read address that is used by the first selectors changes.

* * * * *